United States Patent
Caulfield

(10) Patent No.: US 10,567,684 B2
(45) Date of Patent: *Feb. 18, 2020

(54) SYSTEM AND METHOD FOR USING FILTERING AND PIXEL CORRELATION TO INCREASE SENSITIVITY IN IMAGE SENSORS

(71) Applicant: Cyan Systems, Inc., Santa Barbara, CA (US)

(72) Inventor: John T. Caulfield, Santa Barbara, CA (US)

(73) Assignee: Cyan Systems, Inc., Santa Barbara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/865,002

(22) Filed: Jan. 8, 2018

(65) Prior Publication Data
US 2018/0160059 A1   Jun. 7, 2018

Related U.S. Application Data

(60) Continuation of application No. 15/002,185, filed on Jan. 20, 2016, now Pat. No. 9,866,773, which is a (Continued)

(51) Int. Cl.
*H04N 5/357* (2011.01)
*H04N 5/378* (2011.01)
(Continued)

(52) U.S. Cl.
CPC ....... *H04N 5/3575* (2013.01); *H01L 27/1469* (2013.01); *H01L 27/14609* (2013.01);
(Continued)

(58) Field of Classification Search
CPC .... H04N 5/3575; H04N 5/357; H04N 5/3537; H04N 5/37452; H04N 5/378;
(Continued)

(56) References Cited

U.S. PATENT DOCUMENTS

| 2002/0054299 A1* | 5/2002 | Freifeld | G01B 11/024 356/625 |
| 2002/0105579 A1* | 8/2002 | Levine | H04N 5/2176 348/187 |

(Continued)

*Primary Examiner* — Abdelaaziz Tissire
(74) *Attorney, Agent, or Firm* — Larry E. Henneman, Jr.; Henneman & Associates, PLC

(57) ABSTRACT

An over sampled image sensor in which the pixel size is small enough to provide spatial oversampling of the minimum blur size of the sensor optics is disclosed. Image processing to detect targets below the typical limit of 6× the temporal noise floor is also disclosed. The apparatus is useful in detecting dimmer targets and targets at a longer range from the sensors. The inventions exploits signal processing, which allows spatial temporal filtering of the superpixel image in such manner that the Noise Equivalent Power is reduced by a means of Superpixel Filtering and Pooling, which increases the sensitivity far beyond a non-oversampled imager. Overall visual acuity is improved due to the ability to detect dimmer targets, provide better resolution of low intensity targets, and improvements in false alarm rejection.

16 Claims, 23 Drawing Sheets

Related U.S. Application Data division of application No. 13/663,290, filed on Oct. 29, 2012, now Pat. No. 9,294,690, which is a continuation-in-part of application No. 12/101,139, filed on Apr. 10, 2008, now abandoned.

(60) Provisional application No. 61/553,017, filed on Oct. 28, 2011.

(51) Int. Cl.
| | | |
|---|---|---|
| *H04N 5/374* | (2011.01) | |
| *H04N 5/353* | (2011.01) | |
| *H01L 27/146* | (2006.01) | |
| *H04N 5/217* | (2011.01) | |
| *H04N 5/33* | (2006.01) | |
| *H04N 5/3745* | (2011.01) | |

(52) U.S. Cl.
CPC .. *H01L 27/14625* (2013.01); *H01L 27/14634* (2013.01); *H01L 27/14636* (2013.01); *H01L 27/14685* (2013.01); *H04N 5/2173* (2013.01); *H04N 5/33* (2013.01); *H04N 5/357* (2013.01); *H04N 5/3537* (2013.01); *H04N 5/378* (2013.01); *H04N 5/37452* (2013.01)

(58) Field of Classification Search
CPC ......... H01L 27/14609; H01L 27/14625; H01L 27/14634; H01L 27/14636
See application file for complete search history.

(56) References Cited

U.S. PATENT DOCUMENTS

| | | | | |
|---|---|---|---|---|
| 2006/0023105 | A1* | 2/2006 | Kostrzewski | G06T 3/0018 348/335 |
| 2006/0175529 | A1* | 8/2006 | Harmon | B82Y 20/00 250/207 |
| 2006/0181627 | A1* | 8/2006 | Farrier | H01L 27/14603 348/308 |
| 2006/0256226 | A1* | 11/2006 | Alon | G02B 27/0012 348/335 |
| 2008/0267451 | A1* | 10/2008 | Karazi | G01S 5/16 382/103 |
| 2011/0279652 | A1* | 11/2011 | Eggert | G06T 7/285 348/47 |

* cited by examiner

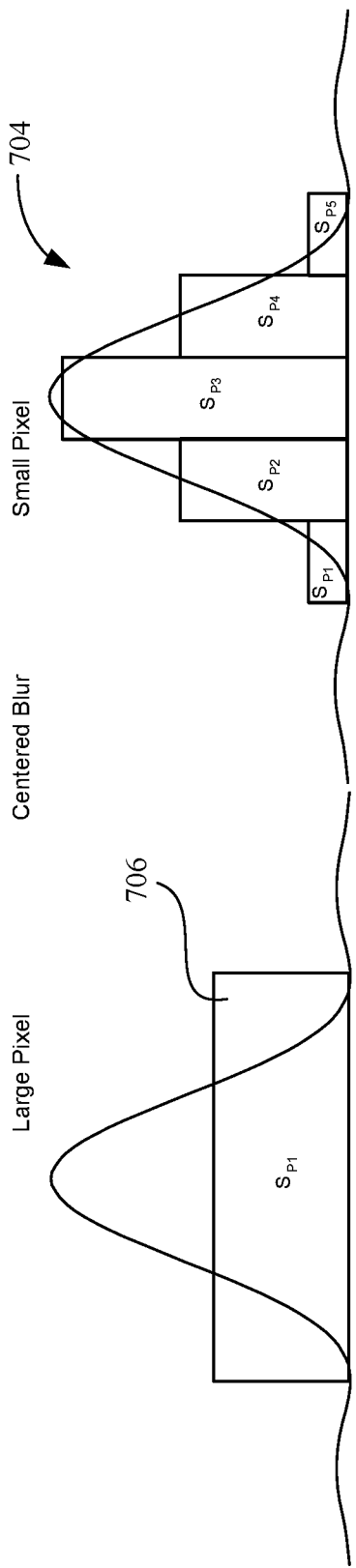

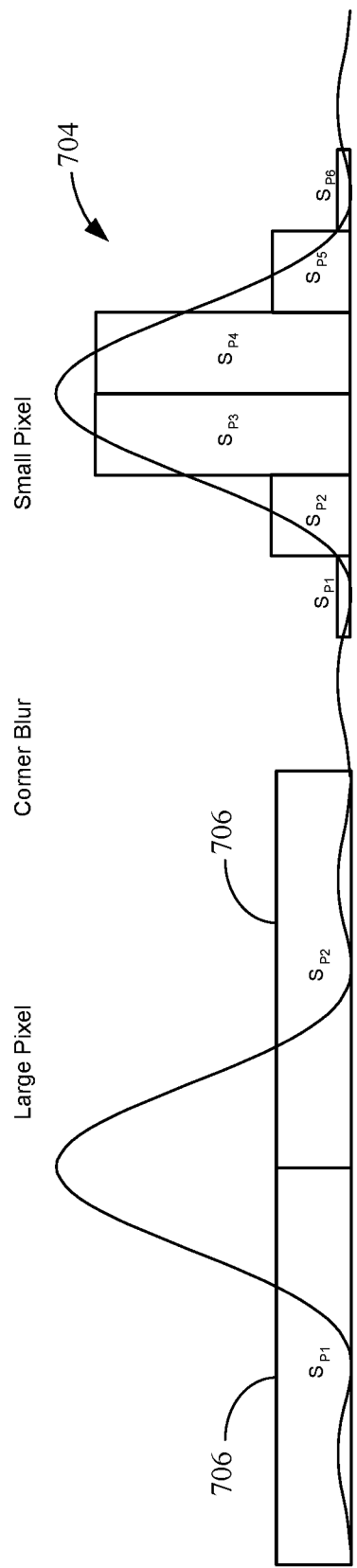

US 10,567,684 B2

SYSTEM AND METHOD FOR USING FILTERING AND PIXEL CORRELATION TO INCREASE SENSITIVITY IN IMAGE SENSORS

RELATED APPLICATIONS

This application is a continuation of co-pending U.S. patent application Ser. No. 15/002,185 entitled System and Method for Using Filtering and Pixel Correlation to Increase Sensitivity In Image Sensors, filed on Jan. 20, 2016 by the same inventor, which is a divisional of U.S. patent application Ser. No. 13/663,290 having the same title, filed on Oct. 29, 2012 by the same inventor, which claims the benefit of U.S. Provisional Patent Application No. 61/553,017 entitled System and Method for Using Pixel Correlation in Image Sensors, filed Oct. 28, 2011 by the same inventor.

U.S. patent application Ser. No. 13/663,290 entitled System and Method for Using Filtering and Pixel Correlation to Increase Sensitivity In Image Sensors, filed on Oct. 29, 2012 by the same inventor, is also continuation-in-part of prior U.S. patent application Ser. No. 12/101,139, entitled Image Detection With Automated Sensing Of An Object Or Characteristic Of That Object, filed on Apr. 10, 2008 by the same inventor.

All of the foregoing patent applications are incorporated herein by reference in their respective entireties.

GOVERNMENT INTEREST

This invention was made with government support awarded by the Defense Advanced Research Project Agency/Army Contracting Command, contract W31P4Q-10-C-0040. The Government has certain rights in the invention.

BACKGROUND

Field of the Invention

The present invention is related to solid state imaging sensors. More particularly, the present invention is related to high sensitivity, high resolution oversampled imaging sensors.

Background Art

Known imaging sensors are composed of a light detecting element that is pixilated. Each pixel converts the incoming photons focused onto a focal plane into electrons and holes, known as photocharge. The photocharge, along with other detector induced charge is injected into the input of a readout integrated circuit amplifier, and the photocharge is stored in charge storage capacitance, typically in the vicinity of the photon detector.

Many past two-dimensional (2D) imaging sensors have individual detectors and individual circuits underneath the detectors to support the capture of the charge generated from the impinging photons. There is uncertainty in the arrival of photons in time, and uncertainty as to where the photon will land on the focal plane array. Because most sensors provide a pixel size that is within a factor of the size of the blur, which is limited by the physical sensor aperture and system optics, often times there are aliasing and artifacts associated with such imagers. In improved sensors, the limitations of the physics of light create random arrival of photons onto each pixel. In addition, with real optics and a limiting aperture, the size of a spot focused from infinity shows an Airy shaped blur, so named due to the work of George Biddell Airy. Because the imaging field has to deal with the uncertainty of photon arrival in time and space, it would be desirable to create a sensor that has improved methods to determine both the temporal and spatial random arrival effects of light in simpler manner.

Past techniques have involved missing, ignoring, or discarding imagery due to lower resolution, higher noise, or challenges with transmitting, storing, and processing high data rate imagery.

Yet other techniques have controllable resolution, but do not possess the means to first detect the entire scene at a high resolution and to then tell the imaging system to provide a lower resolution image to save on bandwidth by not transmitting unwanted imagery data. The problem with these variable resolution approaches is that if there is a new target that appears within a region of lower resolution, the target may not be detected unless another system tells the lower resolution sensor to increase its resolution or, if there is apriori information about the expected appearance of an object or target. Most sensors work in order to sense objects specifically because there is no apriori information on the target.

Image sensors have applications in many fields, including machine vision, guidance and navigation, situational awareness, and general visual security. Advanced sensors may place more image processing near the focal plane circuit, or may use algorithms which improve the resolution, sensitivity, or other performance attribute of the sensor output image.

Pixel size has been limited by the ability to create the necessary interconnect pads and deposit the metal onto the small pads. This in turn limited the ability to have smaller pixels for, for example, infrared (IR) imagers. Furthermore, since the blur size of IR sensors was typically greater than 15 um, some researchers indicated that it was unnecessary to provide for pixels that were much smaller than the pixels of IR imagers.

Efforts are being made to reduce the size power and weight of IRFPAs, and it would be highly beneficial to commercial and military imaging apparatus to also improve on the sensitivity of undersampled pixels to detect objects at longer ranges with improve probability of detection (Pd) and lower probability of false alarms (Pfa).

Yet other techniques have been provided to perform "Super Resolution" on a sequence of undersampled imagers (US 2008/0175452 A1 6/2007 Ye). Such techniques generally require several sequential frames and the further computation of the different frames to estimate their exact translation or location prior to the calculation of a reconstructed superresolution frame.

Another limitation of the Super Resolution techniques for reconstruction is that because they require several frames of data, by definition they have latency in the processing and identification of potential objects or targets. In some cases, the latency results in the inability to track and identify fast moving objects in larger imagery formats.

Yet another limitation of the Superresolution reconstruction techniques is their computational complexity, so that larger computers with near real time capability or with near real time capability are required in order to construct and compute the Super Resolution image. In addition, continuously providing Super Resolution requires that each frame needs to be processed, thus increasing the computational complexity to such a degree that such processing becomes more difficult as the format of the imager increases, and also when the frame rate increases.

In the past the pixel size was limited by the ability to create the necessary interconnect pads and deposit the metal onto the small pads. This in turn limited the ability to have smaller pixels for IR imagers. Furthermore since the blur size of IR sensors was typically greater than 15 um, some researchers demonstrated the issues with undersampled imagery and aliasing and provided computational techniques such as Superresolution Reconstruction and deblurring techniques, to improve the resolution over the native detector limitations. Limitations to these Superresolution Reconstruction techniques are that they can require several image frames to create a higher effective resolution image out of several low resolution frames and, moreover, impose challenging computational complexity and costs to the system.

Another limitation of current imagers is the detection of dim targets in clutter without false alarms.

Another disadvantage of current undersampled imagers is that, when there is platform motion, turbulence, dust/haze and/or other movements, the incident photons are further distributed to other pixels in a manner that will degrade the blur size of an ideal Point Spread Function (PSF). This causes image pixel smears and integrated signal reduction, making it more difficult to detect objects under even limited motion.

What is needed is an imaging sensor that can improve the resolution and acuity of a system in a manner that does not require super resolution reconstruction and the associated challenges.

What is needed is an imaging sensor that can detect dimmer objects at longer distances without creating false positives or false alarms.

To the inventors knowledge all previous apparatus or methods for increasing the visual sensitivity in non-oversampled imagers have been limited to require external techniques to dither and then process and reconstruct the image using several lower resolution frames to improve the resolution. What is needed is a system and/or methods that provide for much higher native resolution and that simultaneously improve the probability of detection of a dim target, while suppressing false positives.

SUMMARY

According to one aspect of the present invention, oversampling of the minimum blur of an imaging system's optics overcomes the limitations posed by undersampling the image, as will be described in detail herein. Aspects of the invention include methods to oversample the limiting blur of imaging sensors. More particularly, the oversampled imagery from a small pixel array is processed in a way that improves the detectivity of targets, by correlating local pixels in the oversampled image, and suppresses false positives in the same oversampled image, thus resulting in the ability to improve the sensitivity and the false alarm rate in real imagery.

An advantage of the oversampled pixels is that, when there is platform motion, turbulence, other movements, and other effects in real imaging, even though the PSF will be degraded, the pixels will oversample the distorted PSF that arises from the distortions. Because under these conditions energy will also be spread in a distorted fashion, but into neighboring pixels, the energy will be conserved within that small local region of pixels in a manner that will show the distortion induced PSF change. For those knowledgeable in the art of imaging and remote sensing there is a Gestalt theory, which provides concepts that have allowed image processing to perceive visual attributes organized by patterns, shapes, motions, and illumination. These visual attributes include top level image connectiveness, proximity, common fate, and other characteristics. The fact that the small pixel noise-equivalent-power (NEP) is improved means that the small pixel oversampled imager is better able to reproduce dim images in motion and atmospherically disturbed image sequences, and the provided means for pixel correlation under both the ideal PSF and the non-ideal PSF to better facilitate distinguishing the Gestalt criterion that governs visual acuity, even under challenging visual sensing conditions.

Another aspect of the inventions includes providing smaller pixels, which improve the effective Noise Equivalent Power of the oversampled array, as compared to undersampled sensor systems.

An example embodiment of present invention is an oversampled imager sensor and system, which provides pixel correlation by oversampling in the spatial and temporal domain. The object of the temporal and spatial correlative oversampling is to increase the effective sensitivity of the imaging sensor using superpixels or super resolved pixels, so that the blur is greater than the pixel size. As used herein, the term "superpixels" refers to pixels that are smaller than the diffraction limited blur of an optical system.

More particularly, example embodiments of the present invention provide oversampled image sensors, in which the pixel size is small enough to provide spatial oversampling of the minimum blur size of the sensor optics. The current invention also provides additional image processing to detect targets below the typical limit of 3×-6× the temporal noise floor. This is useful in detecting dimmer targets and targets at a longer range away from the sensors. Aspects of the present invention also exploit signal processing that allows spatial temporal filtering of the superpixel image in such a manner that the Noise Equivalent Power is reduced by a means of Superpixel Filtering and Pooling. This increases the sensitivity far beyond a non-oversampled imager of the current art.

In a target detection system, spatial temporal filtering can be performed to minimize the background clutter and temporal and spatial noise. Then a threshold is provided to detect objects that are likely above the noise. If a target in a single pixel exceeds the NEP of the sensor by a Signal to Noise factor of 6, then from the photon noise statistics the target can be reliably detected without excess noise creating a threshold exceedance. A threshold exceedance due to noise or clutter is called a false alarm.

For target detection sensors, a limitation in sensitivity arises due to the random arrival of photons, which create photon shot noise and limit the Noise Equivalent detectable Power (NEP). The NEP is directly related the scene background, sensor optical and electronic parameters, and waveband.

Embodiments of the present invention use oversampling with thresholding and correlation to more accurately estimate the uncertainty in the arrival of photons in time, and to improve the uncertainty as to where the photons will land spatially on the optics focal plane. Understanding the statistical distributions of diffraction and photon random arrival, the distributions can be used to estimate where a photon will land, and also estimate the effects of random arrival.

Aspects of the invention provide adaptive temporal and spatial filtering to allow a reduction of the Signal to Noise level at which a detection threshold is set, and then evaluate potential signals on the nearby superpixels to reinforce whether a target is present or not. For example, when the detection threshold is set near the intrinsic noise level given by the light luminance variation, having neighbor pixels sensing a similar target reinforces the likelihood that a target is present. Conversely, if there is an exceedance of the threshold in one superpixel, but not sufficient exceedances in the neighboring pixels, this indicates an uncorrelated exceedance, which indicates noise. This technique of correlating if a nearby pixel has an exceedance is referred to as superpixel pooling. Thus, embodiments of the invention improve the effective sensitivity of a system by improving Pd and reducing Pfa by pooling of the signals.

Embodiments of the invention provide an ability to oversimple and correlate pixels in the imager, to determine the random temporal and spatial distributions of photon arrival.

An imaging system of the present invention includes optics with a limiting aperture and a focal length. The limiting aperture and the focal length define a minimum blur of the system for electromagnetic radiation of a particular wavelength ($\lambda$). The system also includes a sensor array that has a plurality of individual pixels disposed in a focal plane defined by the optics of the system. The sensor array is sensitive to the particular wavelength of electromagnetic radiation, and each of said pixels has a surface area smaller than the surface area of the minimum blur (on the focal plane). The imaging system further includes a noise suppresser operative to identify noise signals from the individual pixels by correlating the signal from a particular pixel with at least one other of the pixels within a predetermined area associated with the particular pixel.

The size of the pixels depends on the optics, but in an example embodiment, the sensors are infrared sensors, and each of the pixels has an area that is less than 225 $\mu m^2$. In another embodiment, each of the pixels has an area that is less than or equal to 56.25 $\mu m^2$. In yet another embodiment, each of the pixels has an area that is less than or equal to 25 $\mu m^2$. In yet another embodiment, each of the pixels has an area that is less than or equal to 15 $\mu m^2$. In yet another embodiment, each of the pixels has an area that is less than or equal to 5 $\mu m^2$. In general, the smaller the pixels for a given wavelength, the greater will be the degree of oversampling.

The pixels do not necessarily have to be rectangular, but in an example embodiment, the sensors are infrared sensors, and each of the pixels is rectangular and has an edge that is less than 25 $\mu m$. In another example embodiment, each of the pixels is rectangular and has an edge that is less than or equal to 12.5 $\mu m$. In yet another example embodiment, each of the pixels is rectangular and has an edge that is less than or equal to 8.5 $\mu m$. In yet another example embodiment, each of the pixels is rectangular and has an edge that is less than or equal to 6.25 $\mu m$. In yet another example embodiment, each of the pixels is rectangular and has an edge that is less than 5 $\mu m$.

In one embodiment, the noise suppressor includes electronic circuitry operative to capture a first image by storing a first intensity value from each pixel of the array of pixels, and to capture a second image by storing a second intensity value from each pixel of the array of pixels. For each particular pixel, the noise suppressor subtracts the first intensity value from the second intensity value to obtain a remainder value associated with each particular pixel. Each remainder value is compared to a predetermined threshold value to determine whether each remainder value exceeds the predetermined threshold value. For each particular pixel associated with one of the remainder values that exceeds the predetermined threshold value, the noise suppressor determines whether each of a plurality of other pixels within the predefined area associated with the particular pixel is also associated with a remainder value that exceeds the predetermined threshold value. If at least a predetermined number of the remainder values associated with the other local pixels exceed the predetermined threshold value, a value indicative of a verified signal is associated with the particular pixel. If at least the predetermined number of the remainder values associated with the other pixels do not exceed the predetermined threshold value, value indicative of a false signal is associated with the particular pixel.

In a particular embodiment, the electronic circuitry of the noise suppressor includes memory for storing data and code. The data includes frames of image data from the sensor array. A processing unit executes the code and is operative to process the frames of image data.

In analyzing the pixel data, subregions of various sizes and shapes can be used. In one embodiment, the plurality of other pixels within a predefined area associated with the particular pixel (subregion) includes at least 3 pixels. In a more particular embodiment, the plurality of other pixels within the predefined area associated with the particular pixel is a 2×2 array of the other pixels. In another embodiment, the plurality of other pixels within the predefined area associated with the particular pixel includes at least 8 pixels and, optionally, the plurality of other pixels within the predefined area associated with the particular pixel is a 3×3 array of the other pixels. In yet another embodiment, the plurality of other pixels within the predefined area associated with the particular pixel includes at least 15 pixels and, optionally, the plurality of other pixels within the predefined area associated with the particular pixel is a 4×4 array of the other pixels. In yet another example embodiment, the plurality of other pixels within the predefined area associated with the particular pixel includes at least 24 pixels and, optionally, the plurality of other pixels within the predefined area associated with the particular pixel is a 5×5 array of the other pixels.

In example embodiments, the image processing circuitry filters the image data by subtracting first a background image from a current single frame image. The first image is a time-averaged image generated from a plurality of frames of image data, and the second image is generated from a single frame of image data.

Novel pixel structures are also disclosed. In an example pixel array, each pixel includes a sensor element, a first storage element and a second storage element. The first storage element is coupled to the sensor element and operative to store one intensity signal from the sensor element at a time. The second storage element is coupled to the sensor element and operative to accumulate a plurality of intensity signals from the sensor element over time. A differencing circuit includes a first input coupled to the first storage element of one of the pixels, a second input coupled to the second storage element of the one of the pixels, and an output. A comparator includes a first input coupled to the output of the differencing circuit, a second input coupled to a predefined reference voltage, and an output operative to provide a signal indicative of whether the output of the differencing circuit exceeds the predefined reference voltage.

In an example embodiment, the pixels are arranged in a plurality of columns and rows. The imaging system includes a first plurality of signal output lines each associated with one of the columns of pixels and being selectively coupled to the first storage elements of the pixels of the associated column. The imaging system also includes a second plurality of signal output lines each associated with one of the columns of pixels and being selectively coupled to the second storage elements of the pixels of the associated column. A plurality of differencing circuits each has a first input coupled to the first storage elements of the pixels of an associated column, a second input coupled to the second storage elements of the pixels of the associated row, and an output. A plurality of comparators each has a first input coupled to the output of an associated one of the differencing circuits, a second input coupled to a predefined reference voltage, and an output operative to provide a signal indicative of whether the output of the associated differencing circuit exceeds the predefined voltage. In a particular embodiment, the sensor elements are integrated in a non-silicon substrate. The first storage elements, the second storage elements, the differencing circuits; and the comparators are integrated in a silicon substrate, and the non-silicon substrate is fixed to the silicon substrate. Optionally, for example with sensors sensitive to visible light, the sensors, first storage elements, the second storage elements, the differencing circuits; and the comparators can all be integrated in a silicon substrate.

The optimal size of the pixels depends on, among other things, the minimum optical blur of the system. In example embodiments, each of the pixels is smaller than the minimum blur divided by N, and N is a positive integer greater than one.

An example method for processing image data, in an infrared imaging system having optics and a pixelated imager with pixels smaller than a minimum blur size of the optics, is also disclosed. The method includes generating a first image data set from multiple frames of image data acquired from the pixelated imager over time. The method also includes generating a second image data set from a single frame of image data from the pixelated imager. The first image data set is subtracted from the second image data set on a pixel-by-pixel basis to obtain a remainder value associated with each particular pixel. Then, each the remainder value is compared to a predetermined threshold value to determine whether each of the remainder values exceeds the predetermined threshold value. For each particular pixel associated with one of the remainder values that exceeds the predetermined threshold value, it is determined whether each of a plurality of other pixels within a predefined area associated with the particular pixel is also associated with a remainder value that exceeds the predetermined threshold value. The method also includes associating a value indicative of a verified signal with the particular pixel if at least a predetermined number of the remainder values associated with the other pixels exceed the predetermined threshold value. The method also includes associating a value indicative of a noise signal with the particular pixel if at least the predetermined number of the remainder values associated with the other pixels do not exceed the predetermined threshold value.

A non-transitory electronically-readable medium is also disclosed. The electronically-readable medium has code embodied therein for causing an electronic device to generate a first image data set from multiple frames of pixelated image data acquired over time by a sensor array having pixels that are smaller than a minimum blur size of the optics of the system in which the sensor array is disposed. The code also causes the electronic device to generate a second image data set from a single frame of pixelated image data acquired by the sensor array, and to subtract the first image data set from the second image data set on a pixel-by-pixel basis to obtain a remainder value associated with each particular pixel. The code also causes the electronic device to compare each remainder value to a predetermined threshold value to determine whether each the remainder value exceeds the predetermined threshold value. The code also causes the electronic device to determine, for each particular pixel associated with one of the remainder values that exceeds the predetermined threshold value, whether each of a plurality of other pixels within a predefined area associated with the particular pixel is also associated with a remainder value that exceeds the predetermined threshold value. The code also causes the electronic device to associate a value indicative of a verified signal with the particular pixel if at least a predetermined number of the remainder values associated with the other pixels exceed the predetermined threshold value. The code also causes the electronic device to associate a value indicative of a noise signal with the particular pixel if at least the predetermined number of the remainder values associated with the other pixels do not exceed the predetermined threshold value. As used herein, the term "non-transitory" includes memories whose contents can be written and re-written.

An imaging device is also disclosed. The imaging device includes an array of sensors formed in a non-silicon substrate. The sensors are arranged in a plurality of columns and rows. A first plurality of storage elements are formed in a silicon substrate fixed to the non-silicon substrate. Each storage element of the first plurality of storage elements is selectively coupled to an associated one of the sensors and configured to store one intensity signal from the associated one of the sensors at a time. A second plurality of storage elements is formed in the silicon substrate. Each storage element of the second plurality of storage elements is selectively coupled to an associated one of the sensor elements and configured to accumulate a plurality of intensity signals from the associated one of the sensor elements over time. The imaging device also includes a first plurality of signal output lines, each associated with one of the columns of sensors and being selectively coupled to the storage elements of the first plurality of storage elements of the associated column. Each of a second plurality of signal output lines is associated with one of the columns of sensors and is selectively coupled to the storage elements of the second plurality of storage elements of the associated column. A plurality of differencing circuits is formed in the silicon substrate. Each of the differencing circuits has a first input coupled to an associated one of the signal output lines of the first plurality of signal output lines, a second input coupled to an associated one of the signal output lines of the second plurality of signal output lines, and an output. A plurality of comparators each has a first input coupled to the output of an associated one of the differencing circuits, a second input coupled to a predefined reference voltage, and an output operative to provide a signal indicative of whether the output of the associated differencing circuit exceeds the predefined voltage.

An object of the invention is to use over sampled pixels in the array, which are individually much smaller than the blur spot from the system optics, to provide spatial oversampling, which improves noise, resolution, and detectivity of objects.

Another object of the invention is to enable the smaller pixels to provide means for improved sensitivity of detecting fewer signal photons. The combination of the ability to oversample and correlate pixels in combination with the ability to detect the arrival of fewer photons improves the visual acuity of the sensor.

Another object of the invention is to provide an oversampled image to improve the detectability/sensitivity and improve dim target resolution.

Another object of the invention is to provide better image sensitivity than current imaging sensor arrays, by using spatial and temporal oversampling to reduce the sampled noise.

Another object of the invention is to provide for greater acuity or the ability to distinguish dim targets while suppressing false alarms from processed imagery from the imaging system.

Another object of the invention is to provide an improved technique of dim target estimation, which improves the ability to determine where the signal photons will land and the ability to estimate the effects of random spatial arrival on the focal plane, thus facilitating robust discrimination of false alarms that reside in single pixels and not in correlated signal clusters.

It is yet another object of the invention to provide oversampling to facilitate pixel correlation to improve the probability of detection and to allow identification and de-selection of certain exceedance pixels from being false alarms in the imaging system.

Another object of the invention is to improve the overall resolution of dimmer objects by critically oversampling sufficiently to reduce aliasing, which will reduce the modulation of point like objects in the sensors video output.

It is yet another object of the invention to overcome the signal modulation and lower resolution, that plagues super-resolution reconstruction, and also to eliminate the need for computational complexities required by larger pixel (IR) sensors that use super resolution reconstruction.

Another object of the invention is to improve the native sampling and resolution, in order to provide real time acuity without having to do multiple image super-resolution reconstruction, thus avoiding the need for a dedicated computer to do the super-resolution reconstruction, thus reducing system complexity.

Another object of the invention is to provide a pixel smaller than the limiting blur, so that even with diminished photons impinging upon the small pixel the pixel amplifier has improved signal to noise ratios, and to also allow the photon random arrival noise to dominate the pixel noise.

Another object of the invention is to provide oversampled pixels to allow improved post processing, such as background suppression of still and moving targets.

Another object of the invention is to provide pixel correlation or pooling to better see through dust storms, rain, snow, hail, fog, high winds, and/or turbulent conditions.

Another object of the invention is to be able to see through a condition called Brown Out. Brown Out occurs when severe windage by helicopters or air turbulence causes severe refractory inducing wind pressure changes and dust disturbance. The Oversampled imager provides multiple paths for the transmission of signals when severe optical refractory beam distortion and physical opacity of the dust distribution diminish the ability to image in Brown Out conditions.

Another object of the invention is to provide oversampled pixels so that clutter and background suppression techniques are more accurate and that background removal residues are improved.

Another object of the invention is (because the oversampled imager will not have modulation of smaller targets like non critically sampled pixel arrays), to improve the function of optical flow and motion flow techniques, that are reliant upon pixel to pixel intensity constancy to make good estimates, for background and foreground velocity calculations, to allow better background suppression, motion flow and differential velocity changes between foreground and background.

Another object of the invention is to use oversampled pixels to provide improved ability for the imaging system to distinguish background clutter from foreground, camouflaged, or background targets.

Another object of the invention is to determine the beam breakup for sensing and correction of distortions in turbulent conditions or laser communications, so that the distortion or beam break up can then be corrected.

Another object of the invention is to use oversampling to provide more detail on the structure of turbulence and provide higher SNR with smaller pixels.

Another object of the invention is to sense severe optical distortion effects, such as occur in underwater imaging, to allow sufficient information to the downstream image processor to correct the more severe distortions.

Yet another object of the invention is to allow greater oversampling ratios (e.g., the number of pixels that will fit into the minimum blur of the imaging system), to be able to better track objects residing closer to the mean of the noise distribution, thereby allowing dimmer target detection, and also further suppressing false alarms as the oversampling ratio is increased.

Various embodiments of the present invention will achieve one or more, but not necessarily all, of the above-recited objects of the invention. The failure of an embodiment to achieve one or more of the recited objects of the invention does not mean that the embodiment is outside of the scope of the present invention, which is defined by the appended claims.

BRIEF DESCRIPTION OF THE DRAWINGS

FIG. 9*a* shows the average signal due the pixel illumination example of FIG. 8*a*;

FIG. 9*b* shows the average signals due to the pixel illumination example of FIG. 8*b*;

FIG. 11a shows the average signal due to the pixel illumination example of FIG. 10a;

FIG. 11b shows the average signals due to the pixel illumination example of FIG. 10b;

DETAILED DESCRIPTION

The embodiments and variations of the invention described herein, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the current invention has multiple applications within several fields for a wide variety of imaging and surveillance systems.

An example embodiment of the present invention includes a highly pixilated sensor array. The pixilation facilitates a plurality of temporal and spatial sampling and filtering combinations or modes. Aspects of the invention provide improved noise characteristics over non-oversampled imagers, because the oversampling improves the minimum detectable power, improves the dim target detection range, and provides for a higher acuity sensor with higher resolution than non-oversampled or non-superpixelated imagers. Superpixelated sensors are sensors that oversample the minimum size blur that is determined by the Airy disk of the sensor lens and the related limiting aperture.

The spatial oversampling facilitates discernment of the shape of blur features in the image from any point like intensity modulation that exists in the field of view. For oversampled imaging sensors, a dim point like target, if detected, will have several pixels with a detectable signal in a locally correlated manner. This change may be in relative motion versus time, in intensity versus time or both. Detecting stationary targets is a challenge because the sensor should have a type of image detection and processing that detect the features of the object in the focal plane array signal which is output from the Readout integrated circuit (ROIC).

An example embodiment of the invention includes a small pixel imaging sensor. The sensor includes a system for utilizing oversampled pixels for improved detection of dim objects, and the improved classification of objects and false alarms, which improves the probability of detection of dimmer objects and reduces the probability of false alarms.

Example embodiments of the invention will now be described in more detail, with reference to the drawings.

Figure 1:
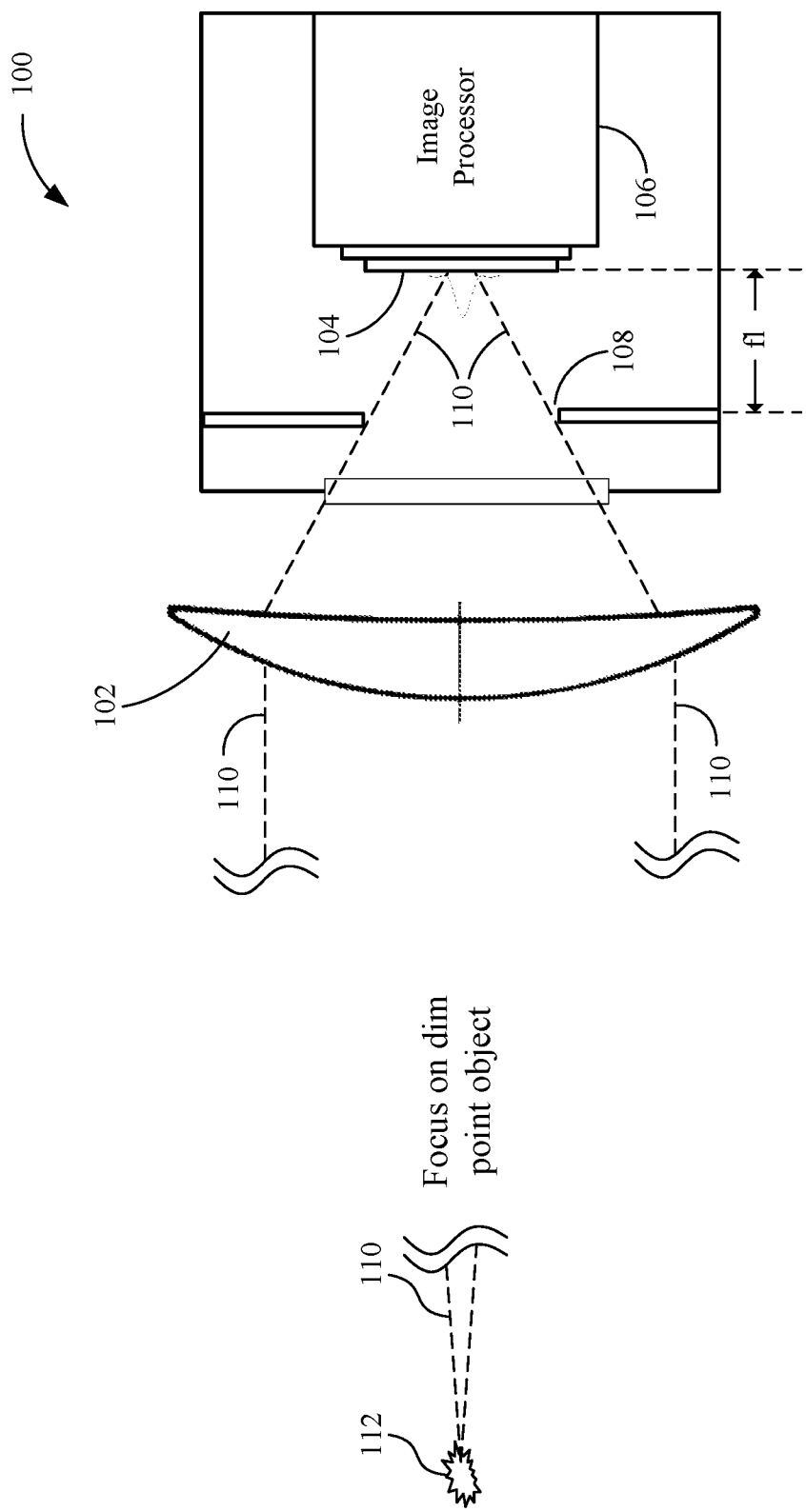
FIG. 1 is a representational diagram of an optical lens system and mechanical components focusing a small object at a large distance on an imaging device.

FIG. 1 is a representational diagram of an imaging system 100, which includes a lens system 102, an imaging device 104, an image processor 106, and a limiting aperture 108. Lens system 102 focuses light 110 from a dim point object 112 onto imaging device 104. Imaging device 104 captures the focused image, by converting incident light to image data, and transfers the image data to image processor 106. Although shown immediately adjacent imaging device 104 in FIG. 1, image processor 106 can optionally be incorporated in imaging device 104, in a separate device under imaging device 104, or in a separate stand-alone computer. Image processor 106 suppresses noise in the captured images by processing the image data, as will be described in more detail below.

Diffraction limits how finely point object 112 can be focused on imager 104. For an ideal optical system with a typical round limiting aperture the minimal blur from the system optics at the focal plane is given by:

$$\text{Blur size} = 2.44\lambda(F\text{-number}), \quad (\text{Eq. 1})$$

where ($\lambda$) is the wavelength given in micrometers and the F-number (F#) is given by:

$$F\# = \text{Focal Length}/\text{Daperture}, \quad (\text{Eq. 2})$$

where Daperture is the diameter of the limiting aperture of the lens and/or optical housing focal stop. As shown in FIG. 1, the focal length (fl) is the effective distance from the focal plane array surface of the array of detectors to the limiting system aperture.

The blur diameter on the focal plane is at a minimum when there is near perfect focus, and when the aberrations of the optics are ideal. In reality, physical optics often depart somewhat from perfect in their aberrations, and the spot size can be 1.2-1.4 times worse than diffraction limited imaging.

Figure 2:
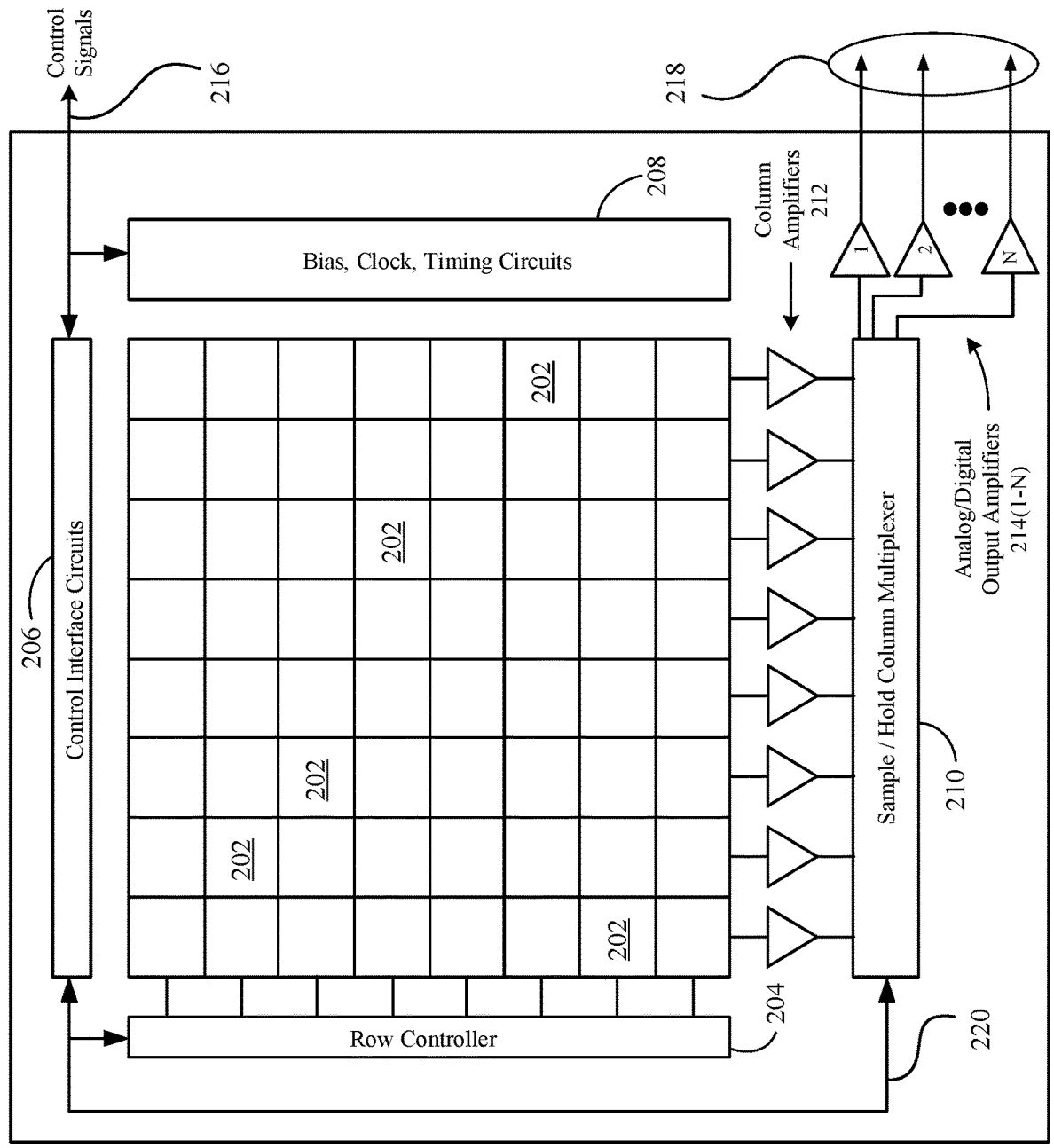
FIG. 2 is a block diagram of the imaging device of FIG. 1.

FIG. 2 is a block diagram of imaging device 104 of imaging system 100. Imaging device 104 includes a two-dimensional (2D) array of pixelated photosensors 202, a row controller 204, control interface circuits 206, bias/clock/timing circuits 208, a sample/hold column multiplexer 210, a plurality of column amplifiers 212 coupling photosensors 202 to sample/hold column multiplexer 110, and a plurality of output amplifiers 112(1-N).

Pixels 202 are arranged in a rectangular array of columns and rows. Only a few of pixels 202 are labeled in FIG. 2 to avoid obscuring the drawing. Each pixel accumulates charge depending on an amount of infrared electromagnetic radiation (e.g., Infrared radiation) impinging on the respective pixel 202. Row controller 204 sequentially asserts row enable/control signals onto each row of pixels 202, which cause pixels 202 of an enabled row to provide their signals, via amplifiers 212, to sample/hold column multiplexer 210, which temporarily stores the signals from pixels 202. Sample/hold column multiplexer 210 outputs the stored signals to image processor 106 (FIG. 1) via output amplifiers 214 (1-N). In the example embodiment, output amplifiers 214(1-N) output analog signals. However, in various embodiments, the conversion of the analog pixel signals to digital values can be accomplished in sample/hold column multiplexer 210, or even in pixels 202.

In the example embodiment of FIG. 2, the array of pixels 202 includes only 8 columns and 8 rows, for the sake of clear explanation. It should be understood, however, that for most applications the array would include a greater number of pixels 202. For example, an array with 1280 columns and 1024 rows would be suitable for some applications. Indeed, embodiments of the invention can be implemented with any desirable number of columns and rows, depending on the particular application.

Unless the number of output amplifiers 214 is equal to the number of columns of pixels 202, sample/hold column multiplexer 210 operates at a faster rate than row controller 204. For example, if there are 8 columns of pixels 202 and only 4 output amplifiers 214(1-4), then sample/hold column multiplexer 210 would operate at approximately twice the speed of row controller 204. In other words, sample/hold column multiplexer 210 would output data about twice as fast as it reads data in from pixels 202.

Imaging device 104 communicates (sends/receives control signals, etc.) with image processor 106 via control signal lines 216, and communicates pixelated image data to imaging processor 106 via data output lines 218. Control interface circuits 206 communicate with row controller 204 and sample/hold column multiplexer 210 via bidirectional signal lines 220.

Pixels 202 of imager chip 104 are smaller than the minimum physical blur size of system 100. The small size of pixels 202 with respect to the blur size of the system facilitates both spatial and temporal oversampling of a scene (an image focused on the plane of the pixel array) using the oversampled pixels (superpixels) of the imager. In this embodiment, pixels 202 are square, 5 micrometer size pixels (i.e., 5 micrometers on each edge). The oversampled 5 micron size pixels are 2-5 times smaller than current 10-25 micron pixel pitch of infrared imaging sensor arrays, respectively.

Unlike imaging device 104, prior undersampled systems were considered to be insufficient to provide the resolution and detail needed to identify objects or targets, specifically point like targets. For example, with 4 micron wavelength midwave infrared light and a typical F/# of 2.5, that the blur size of a prior system would be:

Blur diameter=2.44×wavelength×2.5=2.44×4× 2.5=24.4 micrometers.

Figure 3:
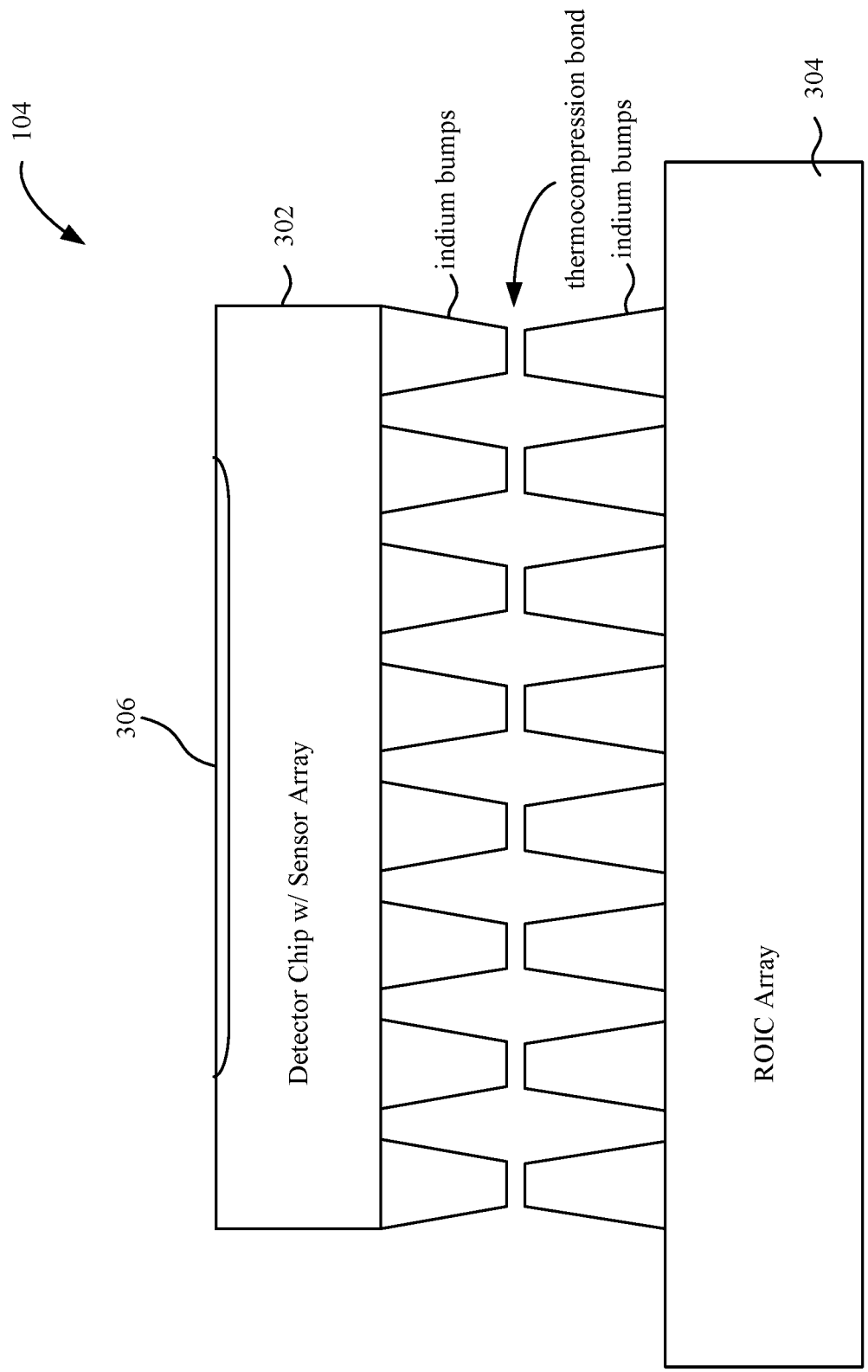
FIG. 3 is a side view of the hybrid imaging device of FIG. 1, wherein the imager chip is separate from a Readout Integrated Circuit (ROIC)

FIG. 3 is a side view of imaging device 104, shown to include a detector chip 302 (in this example an infrared (IR) detector chip) and a readout integrated circuit (ROTC) chip 304. The present invention can be implemented with any of several IR detector types including, but not limited to, InSb, HgCdTe, quantum well infrared photodetector (QWIP), strained layer superlattice (SLS), and InSbAs to have mid-wavelength infrared (MWIR) and long-wavelength infrared (LWIR) sensitivity. Because the detector materials of these types of imagers are different than ROIC 304, which is typically made of silicon, the data and control circuitry of the imager device 104 (e.g., row controller 204, control interface circuits, 206, sample/hold column multiplexer 210, etc.,) is formed in silicon ROIC 304, and IR detector chip 302, which includes the pixelated sensors 306 is mounted and electrically coupled to ROIC 304. Thus, each pixel 202 (FIG. 2) includes a photosensor in detector chip 306 and other elements (e.g., switching transistors, capacitors, etc.) formed in ROIC 304.

IR detector chip 302 and ROIC 304 are hybridized by placing small conductive interconnects at connections to each pixel and also along the periphery to contact the ground of detector chip 302. The photo signal emanating from light absorbed in detector 302 is injected into ROIC 304 by a metal interconnect technology that employs, for example, Indium-bump or other metal interconnects 306. Interconnects 306 are deposited onto either or both IR detector chip 302 and an array of ROIC 304 in a manner that is conducive to the 2-dimensional bonding and facilitates electrical conductance of all pixels. This process is known as hybridization. The process of hybridization is performed using specialized highly precision aligned machines that take the individual die of ROICs and Detectors, both/either with the deposited Indium or metal, and critically align the pieces or die with high precision to properly contact all the metal/indium interconnects over the full array at once. Issues such as alignment issues, non planarity, warpage of the chips, stress, thermal expansion, metal contamination are controlled in order to result in the hybridization of the heterogeneous materials. The process of wafer and die flatness, reductions in pixel size, reduction in the size and manner of the interconnecting metal, and alignment are all progressing. See, for example, R. Balcerak et. al. "Progress in the development of vertically integrated sensor arrays" Proceedings of SPIE, April 2005", which is incorporated herein by reference in its entirety.

Figure 4:
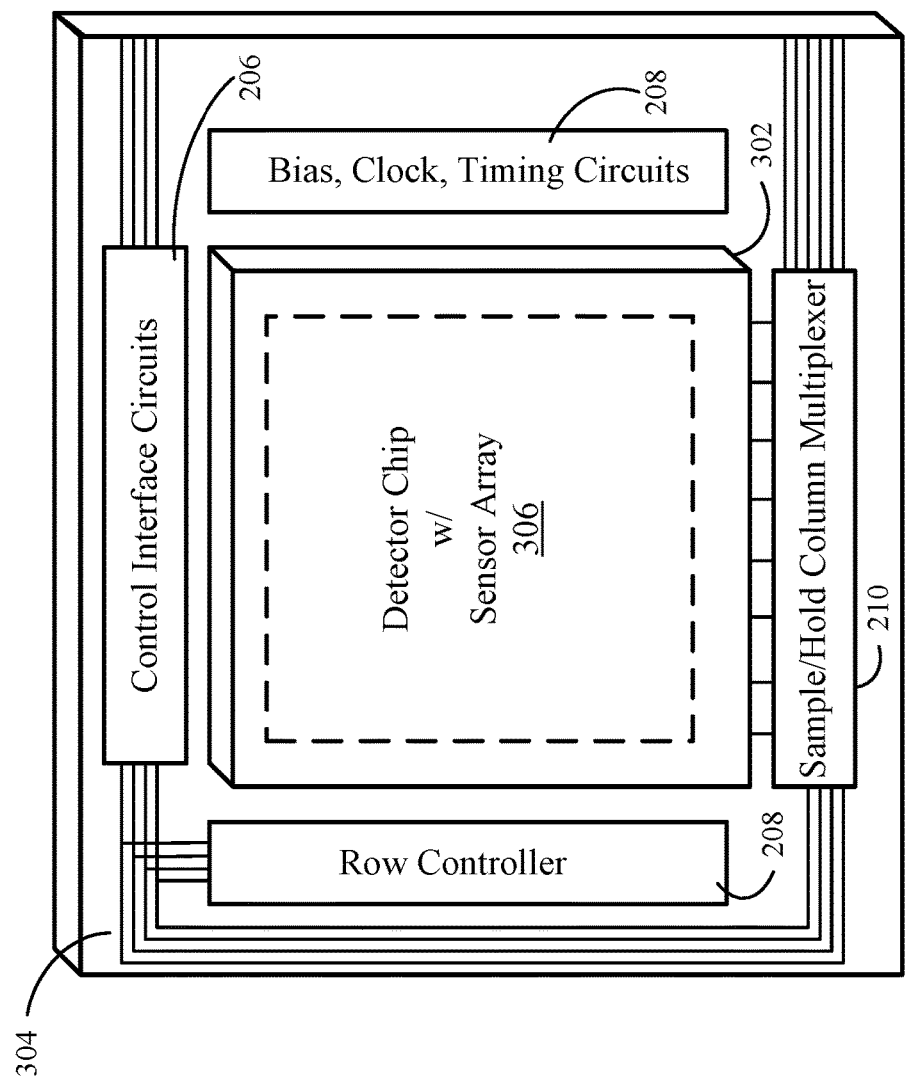
FIG. 4 is a perspective view of a hybridized or integrated detector array mated to the ROIC of FIG. 3.

FIG. 4 shows detector chip 302 mated or hybridized to be on top of the ROIC 304, which is done because the detector is commonly fabricated from IR sensitive materials for making a midwave IR and/or longwave IR sensors. In some sensors the detector circuit is integral to the ROIC, that is that the detector and the ROIC are monolithics, typically in silicon, and in some cases the detector is grown and processed directly on top of the silicon ROIC using techniques such as buffering layers and interstitial layers. Column amplifiers 212 and analog/digital output amplifiers 214(1-N) are omitted from FIG. 4, so as not to unnecessarily obscure the drawing. The control lines are shown in FIG. 4 as representational in nature only, and are not intended to convey any specific number of lines or particular paths.

Figure 5:
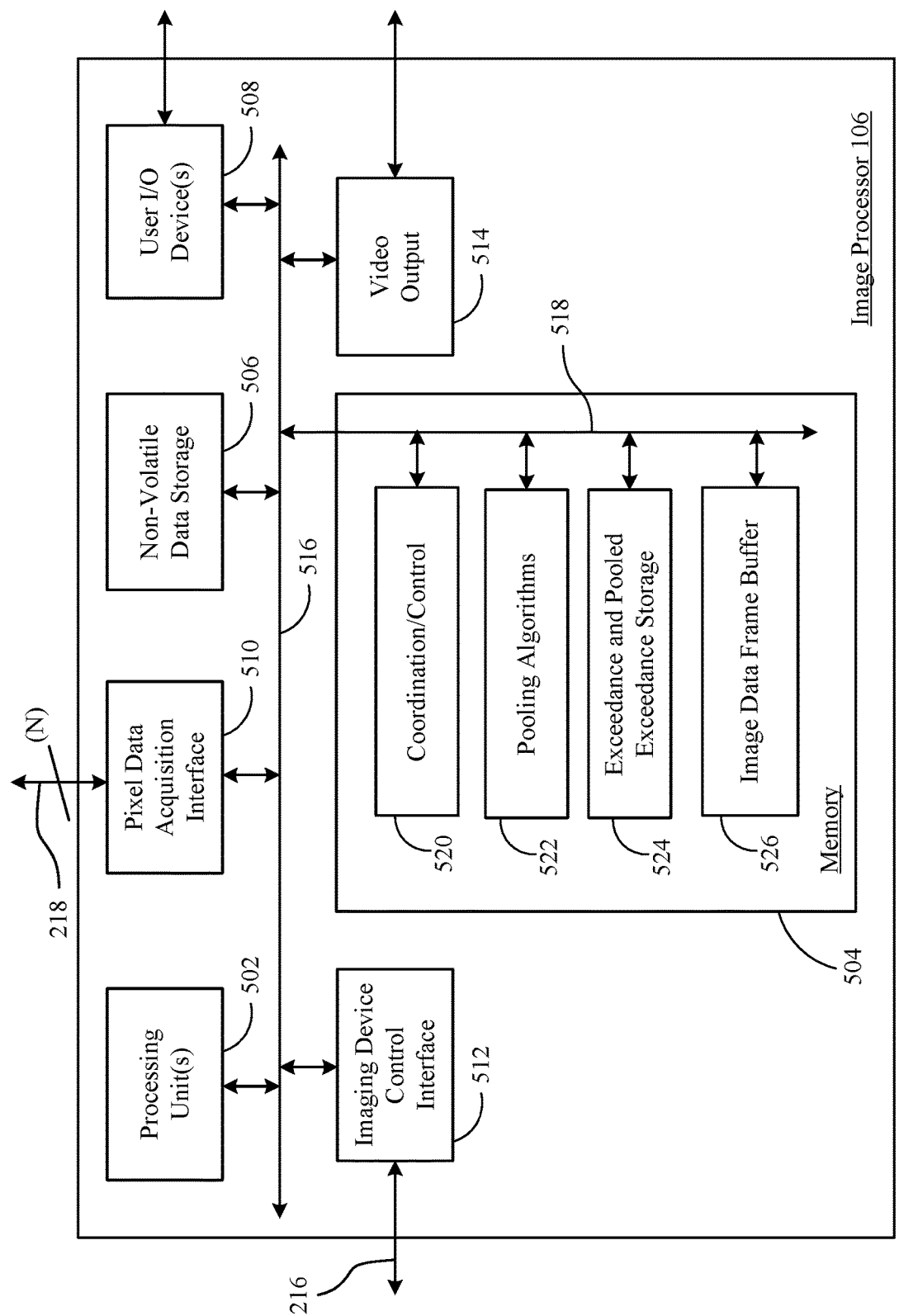
FIG. 5 is a block diagram of the image processor of FIG. 1.

FIG. 5 is block diagram showing image processor 106 in greater detail. In this particular embodiment, image processor 106 is a general purpose computer programmed to carry out the novel image data processing of the present invention. Examples of such general purpose computers include, but are not limited to, personal computers, super computers, system-on-a-chip computers, programmable arrays, and so on. In addition, aspects of the present invention can be embodied in a non-transitory, electronically-readable medium, which has code embodied therein to cause an electronic device to carry out the novel processes disclosed herein.

Image processor 106 includes one or more processing units 502, memory 504, non-volatile data storage 506, user input/output (I/O) devices 508, pixel data acquisition interface 510, imaging device control interface 512, and video output device 514, all intercommunicating via a system bus 516 and a memory bus 518. Processing unit(s) 502 impart functionality to image processor 106 by executing code stored in non-volatile data storage 506 and memory 504. Non-volatile data storage 506 retains data and code, even when image processor 106 is powered down. Memory 504 provides working memory for data and code executed by processing units 502. In actual operation, code is transferred into memory 504 from non-volatile data storage 506 as necessitated by the programs being executed. However, for the sake of clear explanation, the functional features of the present invention are represented by code blocks in memory 504. In addition, some programming (e.g., operating system, device drivers, etc.) of image processor 504 is omitted, because such programming is not necessary for a complete understanding of the present invention.

Pixel data acquisition interface 510 receives pixel data (photo intensity signals) from imaging device 104 via data output lines 218 and transfers the pixel data to memory 504. Imaging device control interface 512 provides control signals to imaging device 104 via control signal lines 216, causing imaging device 104 to acquire images and provide the pixelated image data to pixel data acquisition interface 510.

User I/O devices 508 facilitates communication between image processor 106 and a user. Examples of user I/O devices include, but are not limited to, display monitors, keyboards, pointing devices, speakers, and so on. Communication between image processor 106 and a user can include, but is not limited to, user control signals, the input of system settings, the output of filtered image data, the output of identified targets, and so on.

Video output 514 provides normal (standard) video that has been captured by imaging device imaging device 104. The conventional video that is output by video output 514 is video that has not undergone the filtering and pooling processes of the present invention.

The operation of image processor 106 will now be explained with reference to the representative blocks of code in memory 504. Coordination and control routine 520 provides high level coordination and control over the other code being executed by processing unit 502. Pooling algorithms 522 operate on the pixelated image data to filter and analyze the image data according to the inventive processes, which will be disclosed below in greater detail. For example, pooling algorithms 522 identify pixel signals that appear to indicate the presence of a real target and then correlate the pixel signals with neighboring pixel signals to suppress false alarms. Exceedance and pooled exceedance storage 524 include data calculated and used/reused by pooling algorithms 522. Image data frame buffer 526 stores one or more frames of pixelated image data, which is analyzed by pooling algorithms 522.

Figure 6:
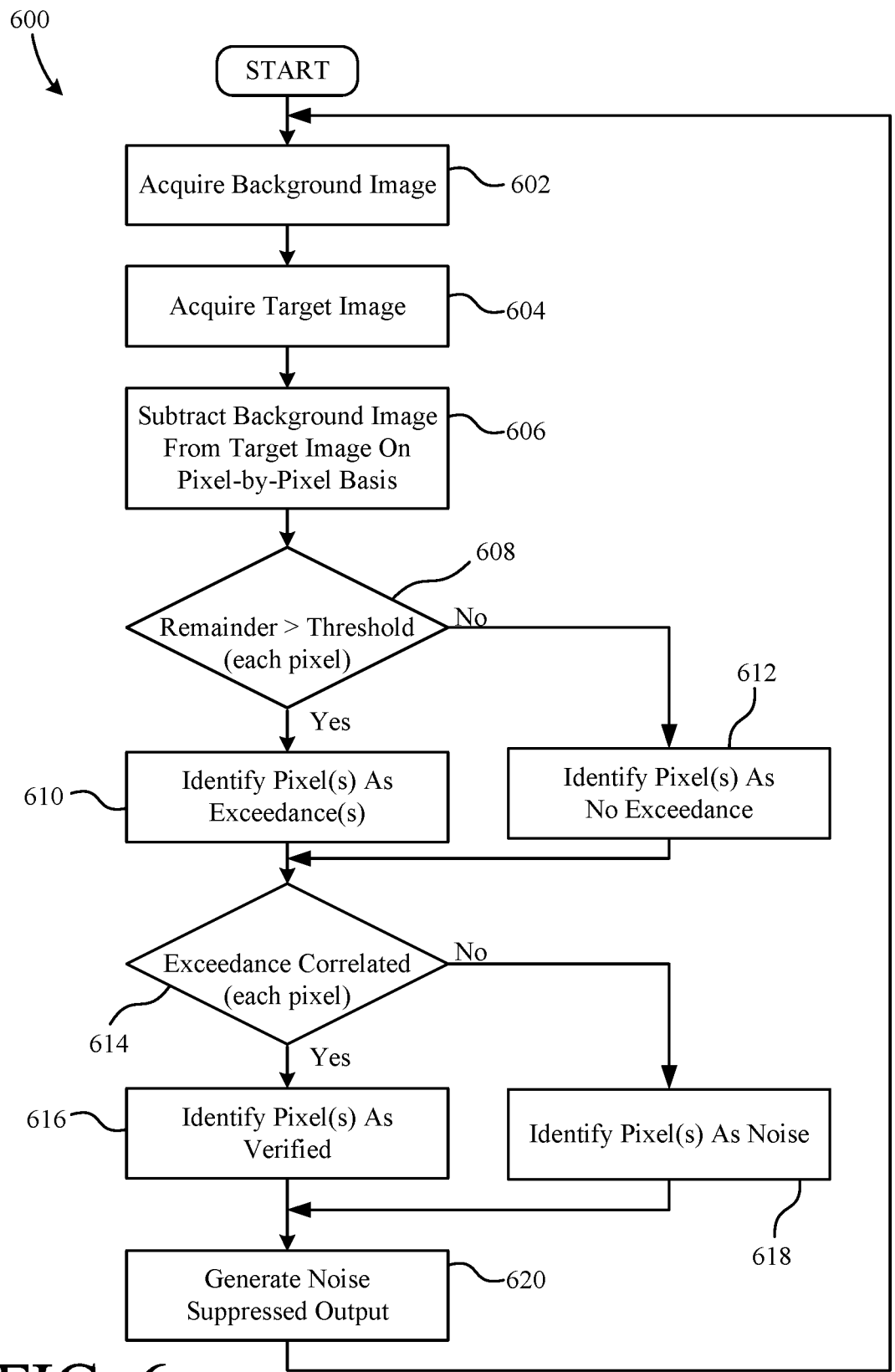
FIG. 6 is a flowchart summarizing one method of processing image data according to the present invention.

FIG. 6 is a flowchart summarizing an example method 600 of noise suppressed image/video processing of the present invention, as can be implemented by image processor 106. In a first step 602, a background image is acquired and, in a second step 604, a target image is acquired. Then, in a third step 606, the background image is subtracted from the target image on a pixel-by-pixel basis to obtain a remainder value for each pixel. Next, in a fourth step 608, each remainder value is compared to a predetermined threshold value to determine whether each remainder value exceeds the threshold value. An exceedance can also be defined as a negative value, for example in applications where the system is trying to identify a dark image against a bright background. For pixels whose remainder values exceed the threshold value, those pixels are identified, in a fifth step 610, as an exceedance. For pixels whose remainder values do not exceed the threshold value, those pixels are identified, in a sixth step 612, as not being an exceedance. Next, in a seventh step 614, the identified exceedances are correlated, by determining whether other pixels within a predefined area associated with each particular pixel (e.g., neighboring pixels) are identified as exceedances. Then, if a predetermined number of neighboring pixels are identified as exceedances, in an eighth step 616, the subject pixels are identified as a verified signal. Otherwise, if less than the predetermined number of neighboring pixels are identified as exceedances, in an ninth step 616, the subject pixels are identified as a noise signal (false alarm). Finally, in a tenth step 620, noise suppressed data (e.g., video, image, alarms, etc.) is output, and method 600 repeats.

Optionally, even pixels that are not initially determined to be an exceedance by comparison to the threshold value can be determined to be a pooled exceedance if the number of neighboring pixels that are identified as exceedances is sufficiently high. This method of identifying a nonexceedance as a pooled exceedance can, among other advantages, compensate for faulty pixels in an imaging device.

Figure 7C:
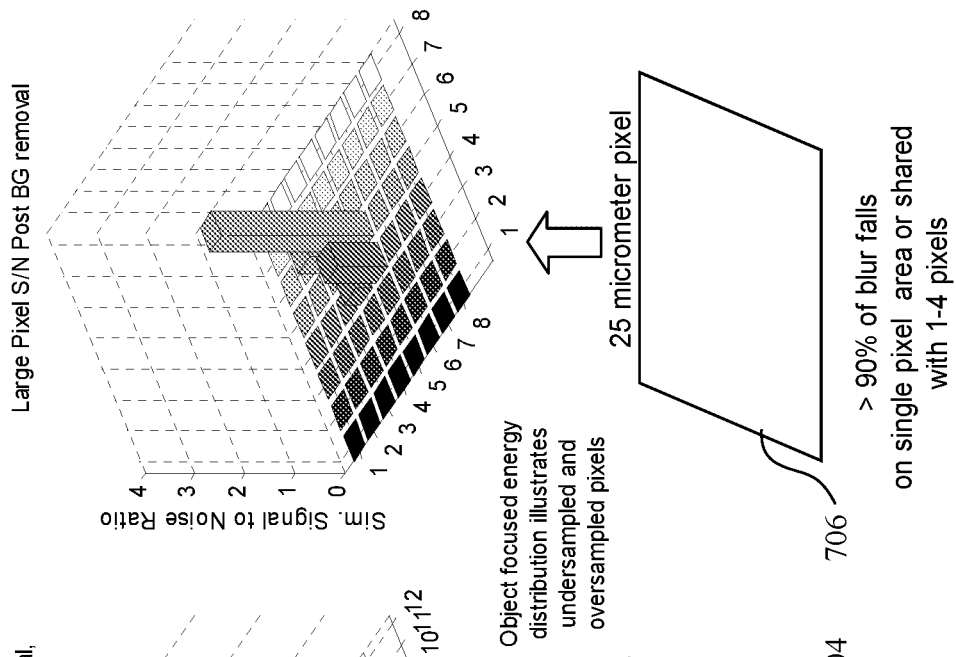
FIGS. 7(*a-c*) are a graphical representation of an oversampled Superpixel array of the present invention and the energy from a small point object on the pixels of imaging arrays with different pixel sizes.
Figure 7B:
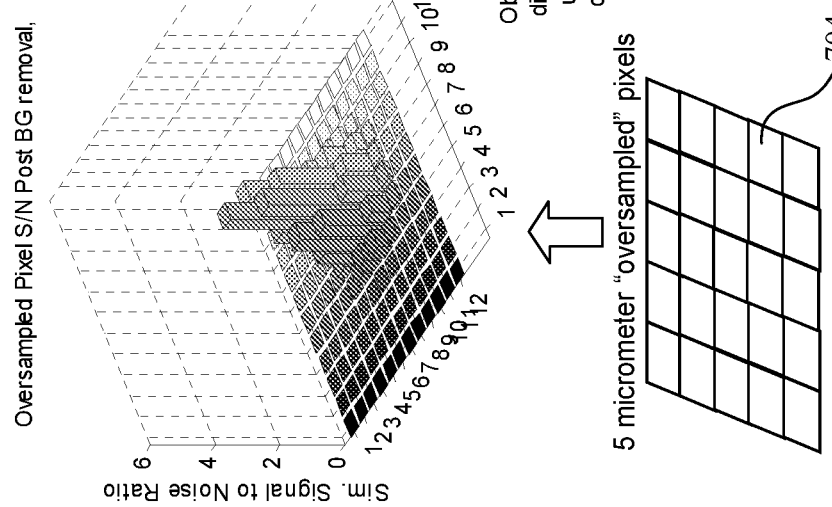
Figure 7A:
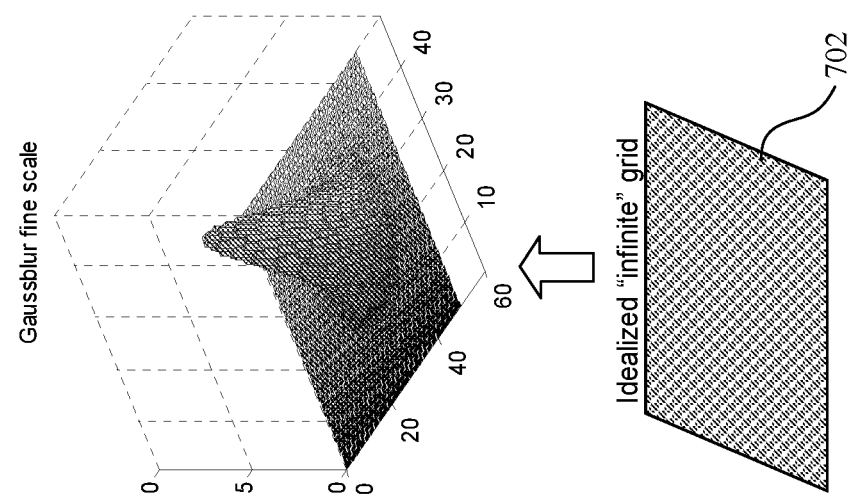

FIGS. 7(a-c) show a blur impinging upon the imager focal plane that obeys the diffraction limit set by 4 micron mid wave infrared light using a F/2.5, so that the ideal blur circle is approximately 24.4 microns. FIG. 7(a) shows that in an idealized "infinite" grid 702, the blur energy falls on an infinite number of individual pixels, so the blur shape can be perfectly detected. FIG. 7(b) shows a sub-array 704 of 5 um oversampled pixels, and FIG. 7(c) shows a 25 um pixel 706, respectively, of an infrared imaging sensor. FIG. 7(c) illustrates that with an approximately 24.4 urn pixel blur, typical for infrared optics, nearly all the blur energy from the optics falls onto a single pixel. In contrast, FIG. 7(b) illustrates that the energy from the 24.4 um blur is distributed over a plurality of the 5 um "super" pixels of the array.

It should be understood that even if aberrations degrade the blur of a real optical system, the ability to detect dim targets and maintain sufficient NEP will still be achieved, because most systems are within a factor of 25% of ideal with modern compensated lens designs.

Figure 8B:
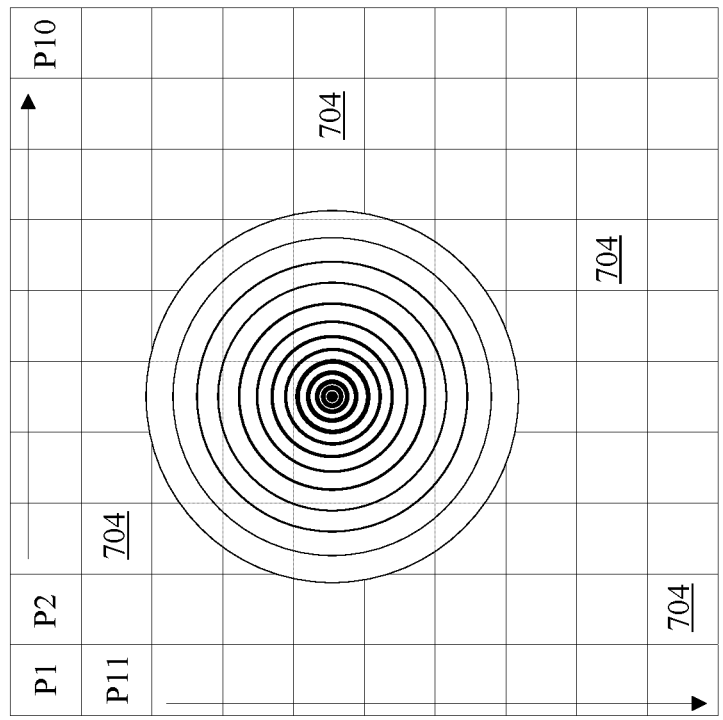
FIG. 8*b* shows the minimal blur of the optics systems incident upon a plurality of pixels in a small-pixel, oversampled imaging array.
Figure 8A:
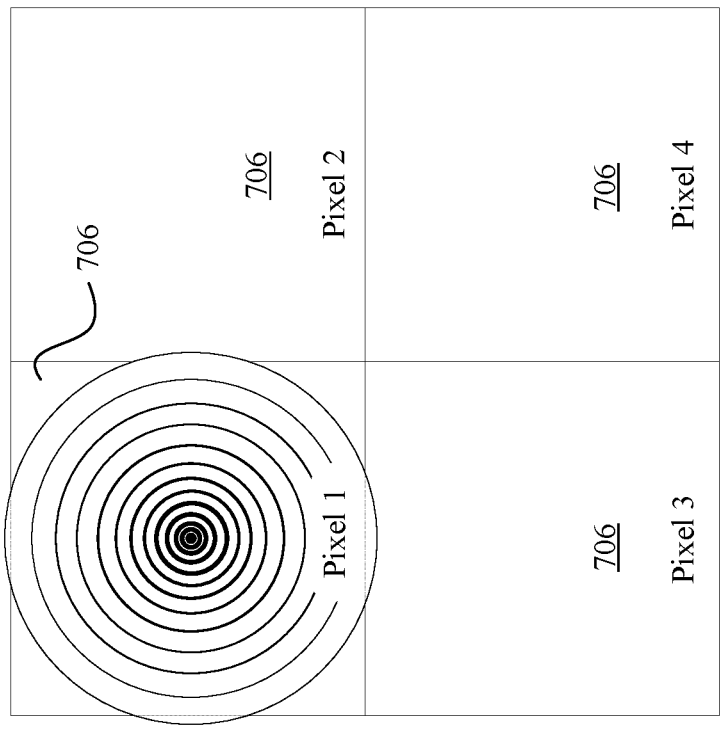
FIG. 8*a* shows the minimal blur of an optics systems incident upon only one pixel in a large-pixel, non-oversampled imaging array.

FIGS. 8(a-b) show that for the diffraction blur of FIGS. 7(a-c) of a 4 micron IR light source near infinity and properly focused, the majority of the entire blur energy coincides in a signal pixel 706 of the array of large pixels 706. Since the blur from the optics is the same size regardless of the size of the pixels, the small pixel army has the light field of the minimal blur impinging a grid of 5×5 pixels 704 for the current example. Only a few of the 100 pixels shown in FIG. 8(a) are labeled, so as not to unnecessarily obscure the drawing.

It should be understood that the concentric rings in FIG. 8(a) and subsequent figures are intended to represent the area-optical intensity profile of the blur spot in a qualitative manner, but not intended to convey any specific intensity profile.

FIG. 9(a). shows the pixel sample energy distribution over the larger pixel 706, and FIG. 9(b) shows the pixel sample energy distribution over the small pixel array 704. FIG. 9a illustrates that the signal decreases as it crosses from pixel center to pixel edge. However, the energy still falls predominantly on a single pixel, and it is not possible to detect this profile with a single pixel sensor. In contrast, FIG. 9b shows the pixel sample energy distribution as it impinges on the oversampled pixel array 704. In the oversampled pixel array 704, a significant portion of the blur energy falls on a plurality of pixels/sensors, so the dispersion of the blur can be detected with multiple pixels.

Techniques such as superresolution reconstruction were developed, so that several images could be combined to increase the effective resolution to sufficiently see a point like object. Such techniques require a computer to process several frames in succession, resampling the frame and estimating frame motion to populate a resampled pixel grid.

FIG. 9(b) illustrates that with oversampling all images, foreground or background, that the image is more faithfully captured without aliasing or object modulation. Furthermore the lack of high frequency target modulation will result in lower image artifacts in the calculating of subpixel motion for critical processing steps such as optical flow, target thresholding and detection.

Figure 10B:
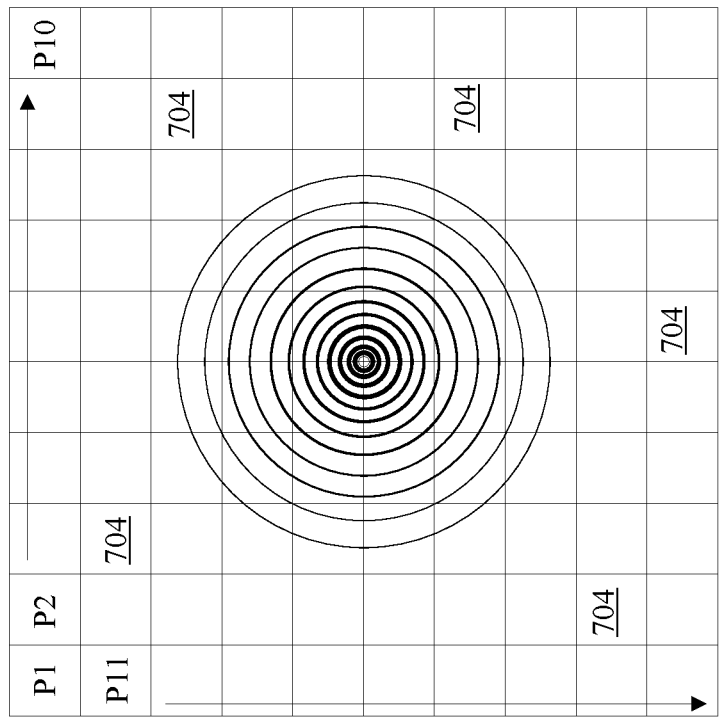
FIG. 10b shows the minimal blur of the optics systems incident upon a plurality of pixels in the small-pixel, oversampled imaging array, where the peak of the point spread function is upon the corners of four of the small pixels.
Figure 10A:
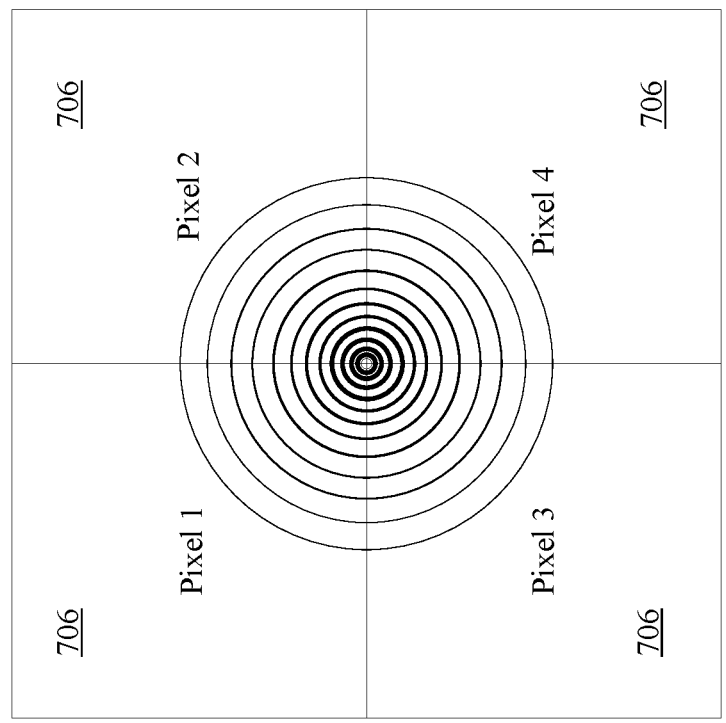
FIG. 10*a* shows the minimal blur of the optics systems incident upon the corners of four pixels of the large-pixel imaging array.

FIG. 10(a) shows that the image intensities of the blur vary dramatically when the blur is centered on a corner between pixels (25% signal energy per pixel), as compared to being centered on a single pixel (100% signal energy) of the large array 706. When the blur impinges equally on 4 pixels in a corner illumination, only 25% of the blur energy falls on each pixel. In contrast, FIG. 10(b) shows that there is not such a dramatic difference in signal energy between adjacent pixels in the small pixel array 704 when the image shifts slightly.

FIG. 11(a) shows the dispersion of the blur energy across the large pixels 706 of the large pixel array, when the blur is centered on a corner between the pixels 706. In contrast, FIG. 11b shows the pixel sample energy distribution as it impinges on the oversampled array of pixels 704, when the blur is centered on a corner between the pixels 704. In the oversampled array of pixels 704, a significant portion of the blur energy falls on a plurality of pixels/sensors, so the dispersion of the blur can be detected.

Figure 12:
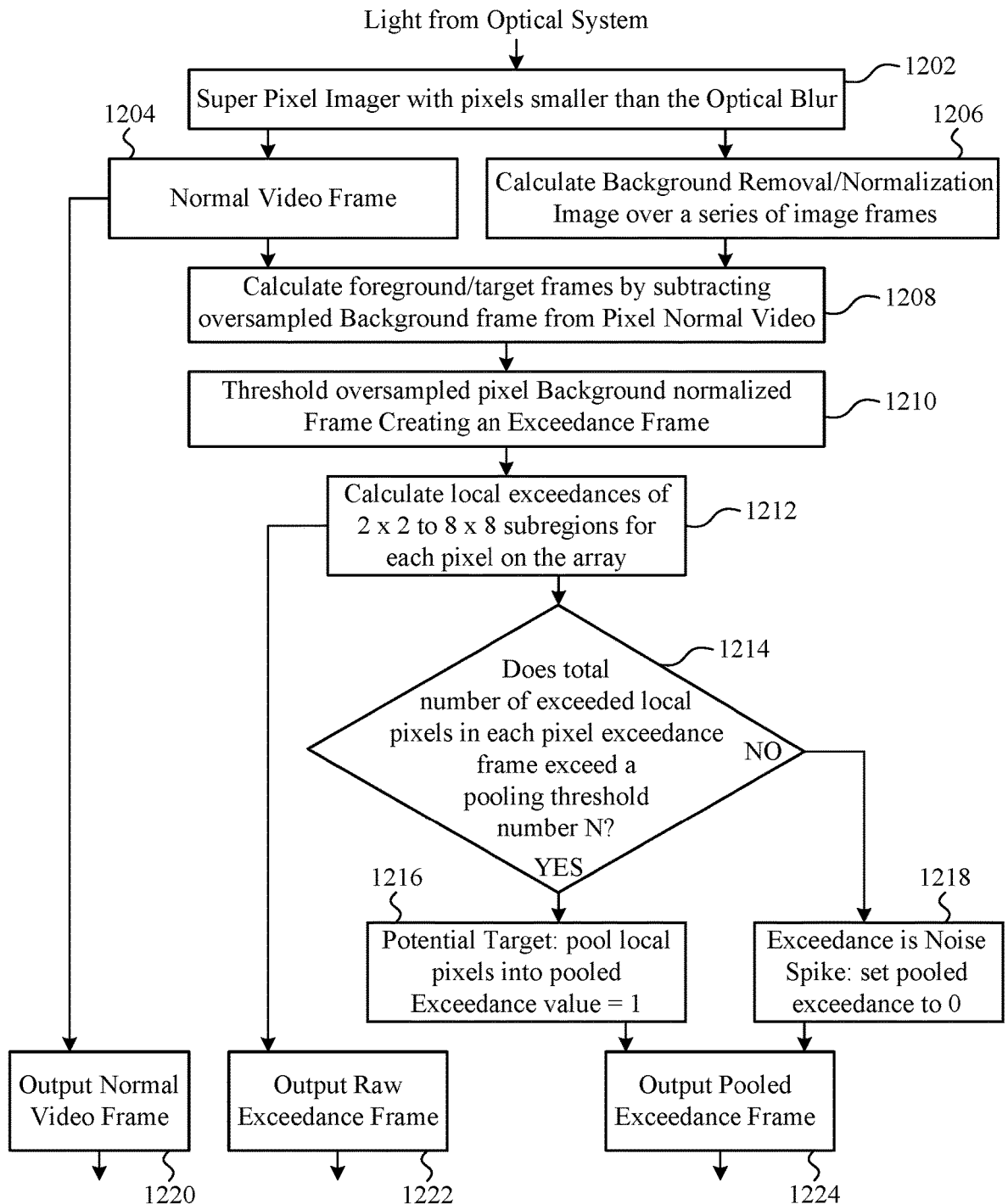
FIG. 12 is flow diagram summarizing an example method of spatial and temporal data processing.

FIG. 12 is a flow diagram summarizing a signal processing method of the invention. Light from the scene impinges upon the imager optics and is focused onto the focal plane of an imager having pixels that are smaller than the minimum blur size defined by the imager optics. The various processes can be carried out on an ROIC, in an external computer, or any other suitable electronic system.

In step 1202, an image is formed when light impinges upon the detector material, converting the particles of light, photons, into photo-electrons, which are stored in capacitors in or under the pixel. At this point the system can output the data through a digital converter to a signal processing electronic system, or the stored data can be processed on the imager semiconductor integrated circuit.

In steps 1204 and 1206, respectively, a normal video frame and a background estimate are made to suppress the background, so that later the background can be removed. Several techniques exist to estimate background and compensate for motion of the sensor, so that an accurate subpixel background removal is achieved.

In step 1208, a background normalized image is created by subtracting the background image from the normal oversampled pixel image. The background estimator filter has a time constant of about 400 ms to 20 seconds. This subtraction of the background frame reduces the clutter and noise as will be shown in more detail below.

In step 1210, the Background normalized filtered image has a threshold applied to every pixel so that if the value of any of the pixels exceeds a local or global threshold then these pixels are assigned as "exceedances". The threshold value is typically a factor of 1-6 times the filtered temporal noise level of the pixels.

In step 1212, for all pixels in the raw exceedance frame, the local neighborhood surrounding the central pixel in a 2×2 to 8×8 subregion is counted. So, depending on the size of the local neighborhood, the number of local pixels that are also exceeding the threshold can vary. For example, in the case of the 8×8 local subregion there can be 0-63 other exceedances.

In step 1214, local pooling or correlation calculation occurs by counting the number of pixels in each subregion as defined in step 1212 above. If the number of exceedances in each pixel local subregion exceeds a predetermined pooling threshold number (N), then this is called a pooled exceedance. Pooling is similar to pixel correlation, but done in a binary manner for simplicity in calculations.

In step 1216, if the number of local pixels that are exceeded is greater that the pooling threshold number (N), then the pixel has a pooled exceedance. This corresponds to sensing a potential target because several local pixels are also exceeded. In other words, the superpixels have sensed a real blur, as opposed to single pixel noise.

In step 1218, if the number of exceedances in the local neighborhood is less than the pooling number (N), the subject exceedance corresponds to a noise spike. If few or none of the local pixels are exceeded, then this is not a pooled exceedance.

After this image processing the Normal Video (step 1220), the Raw Exceedance frame (step 1222), and Pooled Exceedance frame (step 1224) are output.

Figure 13A:
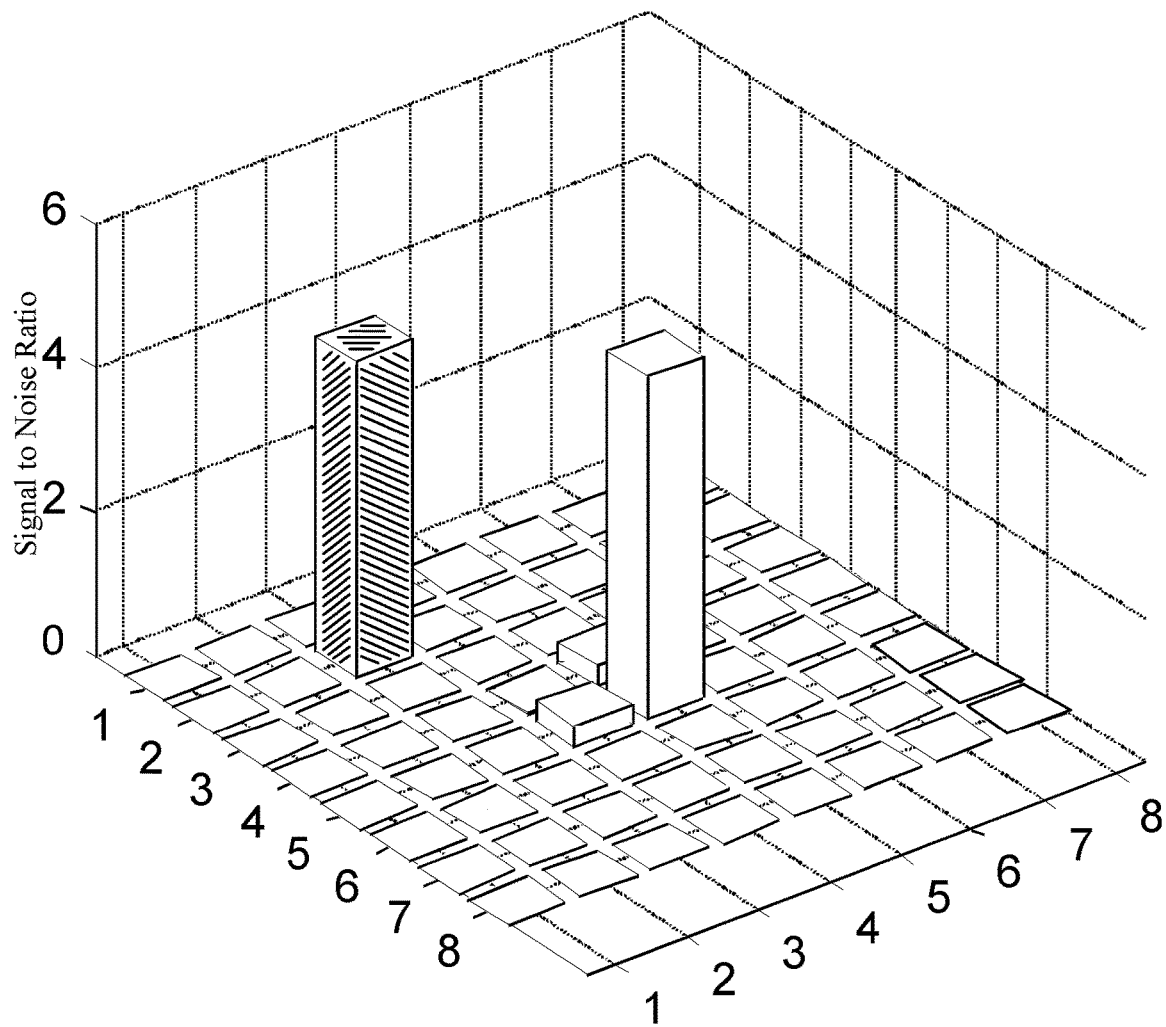
FIG. 13(a) shows a region of undersampled neighboring pixels and the corresponding signal to noise ratio of pixels in the region along with a separate single pixel noise spike.
Figure 13B:
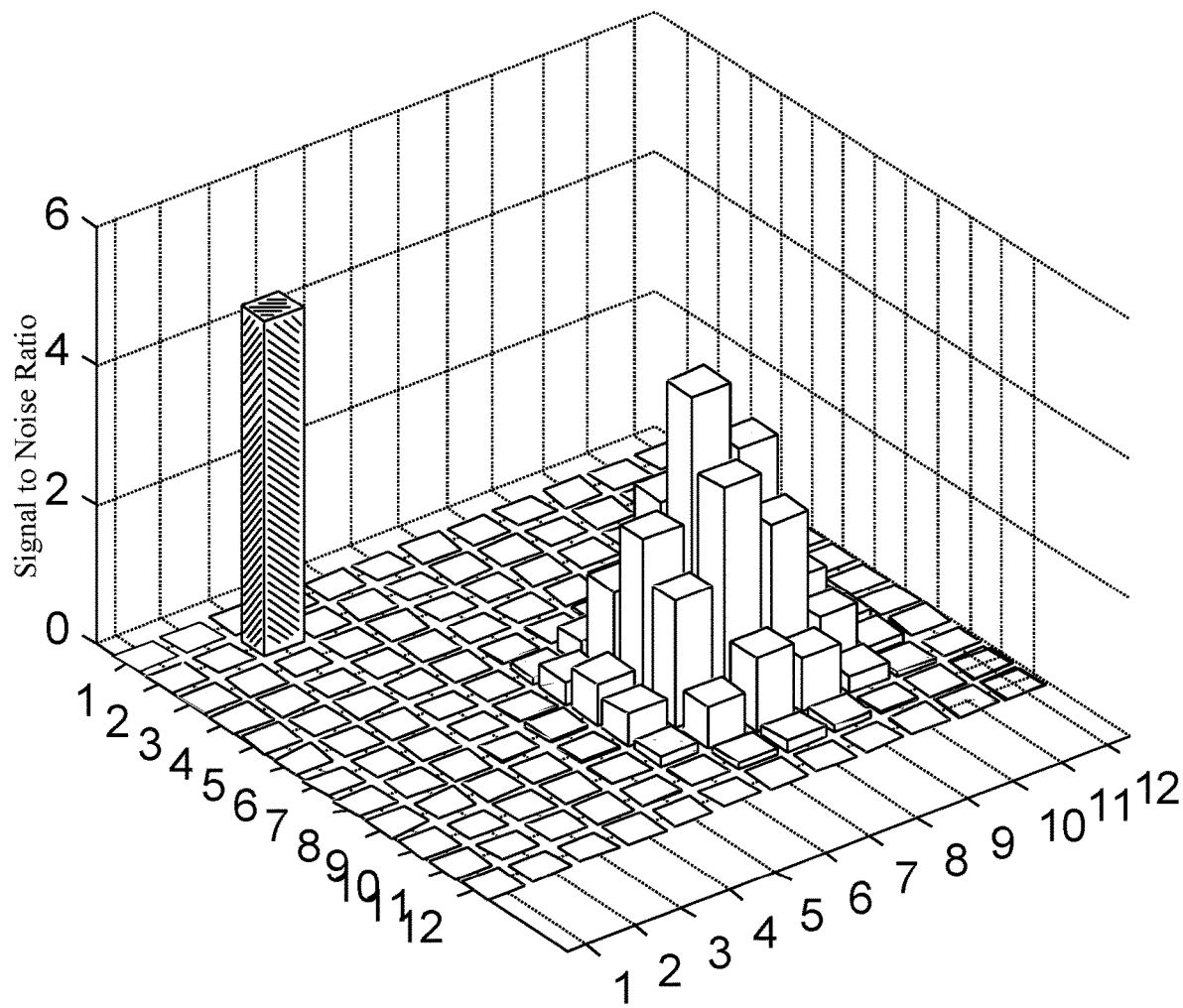
FIG. 13(b) shows a correlated region of oversampled neighboring pixels responding in a correlated manner and the corresponding signal to noise ratio of that region along with a separate single pixel noise spike that is not correlated to its neighboring pixels.

FIG. 13(a) and FIG. 13(b) illustrate how noise can be more effectively identified by an imager wherein the pixels are substantially smaller than the minimum blur of the optics by comparing pixel response maps from a low Signal to Noise Point Target after the background has been removed. FIG. 11(a) is the small signal impinging on the large pixel array, and FIG. 11(b) is the small signal impinging upon the oversampled array. In each figure, the white bars represent the actual signal and the shaded bar represents a noise spike. In the large pixel array (FIG. 13(a)), the single illuminated pixel of the large imaging array has only a single large response, and the neighboring pixels' responses are so muted or attenuated that they cannot be relied upon to pass the detection algorithms test for valid target. In contrast, the small pixel array (FIG. 13(b)) has a real blur required by the physics of the lens, and results in the neighboring pixels having a correlated local pixel change of significant magnitude that it can be relied upon to pass the detection algorithms test for valid target. The noise spike in the small pixel array can be easily identified as such, because it does not have a real PSF required by the optics system and can, therefore, be safely identified as a false alarm. However, in the large pixel array of FIG. 11(b), the false alarm has the same attributes in amplitude and spatial extent as the actual target. Therefore, it would be much more difficult, if not impossible, for the system detection algorithm to discriminate between the target signal and the false alarm.

Figure 14:
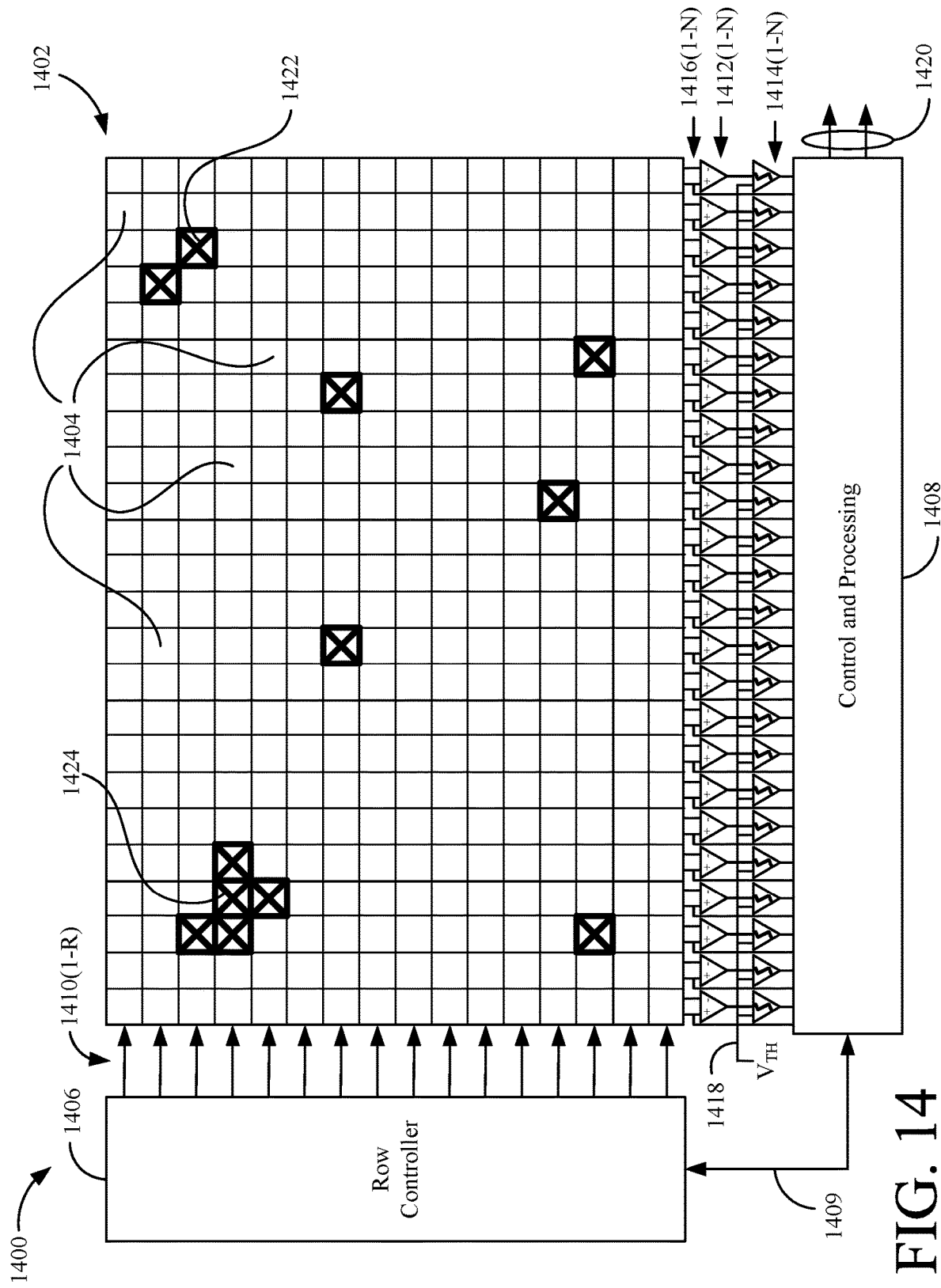
FIG. 14 is a block diagram of an alternate imaging device, wherein filtering, exceedance determination, and pooling are accomplished on the readout integrated circuit (ROIC)

FIG. 14 is a block diagram of an alternate imaging device 1400, wherein background imaging, pixel filtering, exceedance calculations, and pixel correlation/pooling carried out in the imaging device and the ROIC.

Imaging device 1400 includes an array 1402 of pixels 1404 arranged in a plurality of columns and rows. Imaging device 1400 also includes a row controller 1406 and a control and processing circuit 1408. Control and processing circuit 1408 controls and coordinates with row controller 1406, by exchanging control signals via control lines 1409. Row controller 1406 provides control signals to pixel array 1402, via row control signal lines 1410(1-R) to sequentially enable/control the rows of pixels 1404, causing the rows of pixels to output their pixelated image data to control and processing circuit 1408.

Each column of pixels 1404 in array 1402 is coupled to control and processing circuit 1408 via a respective one of a plurality of differencing circuits 1412(1-N) and a respective on of a plurality of comparators 1414(1-N). Each column of pixels 1404 shares one respective pair of a plurality of pairs of background and current signal output lines 1416(1-N). Each pair of background and current signal output lines 1416(n) is coupled to the input of a respective one of differencing circuits 1412(n). The output of each differencing circuit 1412(n) is coupled to a first input of a respective one of comparators 1414(n). The second input of each comparator 1414(1-N) is coupled to a threshold voltage $V_{TH}$. The output of each comparator 1414(1-N) is coupled to control and processing circuit 1408. As will be described in greater detail below, the output of each comparator 1414(n) indicates whether the signal on an associated pixel 1404 should be identified as an exceedance. The dark Xs on particular pixels 1404 indicate that the associated pixel has been identified as an exceedance.

In this example embodiment, array 1402 includes 24 columns and 16 rows. Thus, for this example embodiment, N=24 and R=16. Lower case (r) and (n) are used in the reference indices to identify an arbitrary row or column respectively. It should be understood however, that the present invention can be embodied in arrays having any suitable number of columns and rows, depending on the particular application. For example, a typical image sensor might include 1280 columns and 1024 rows.

Figure 15:
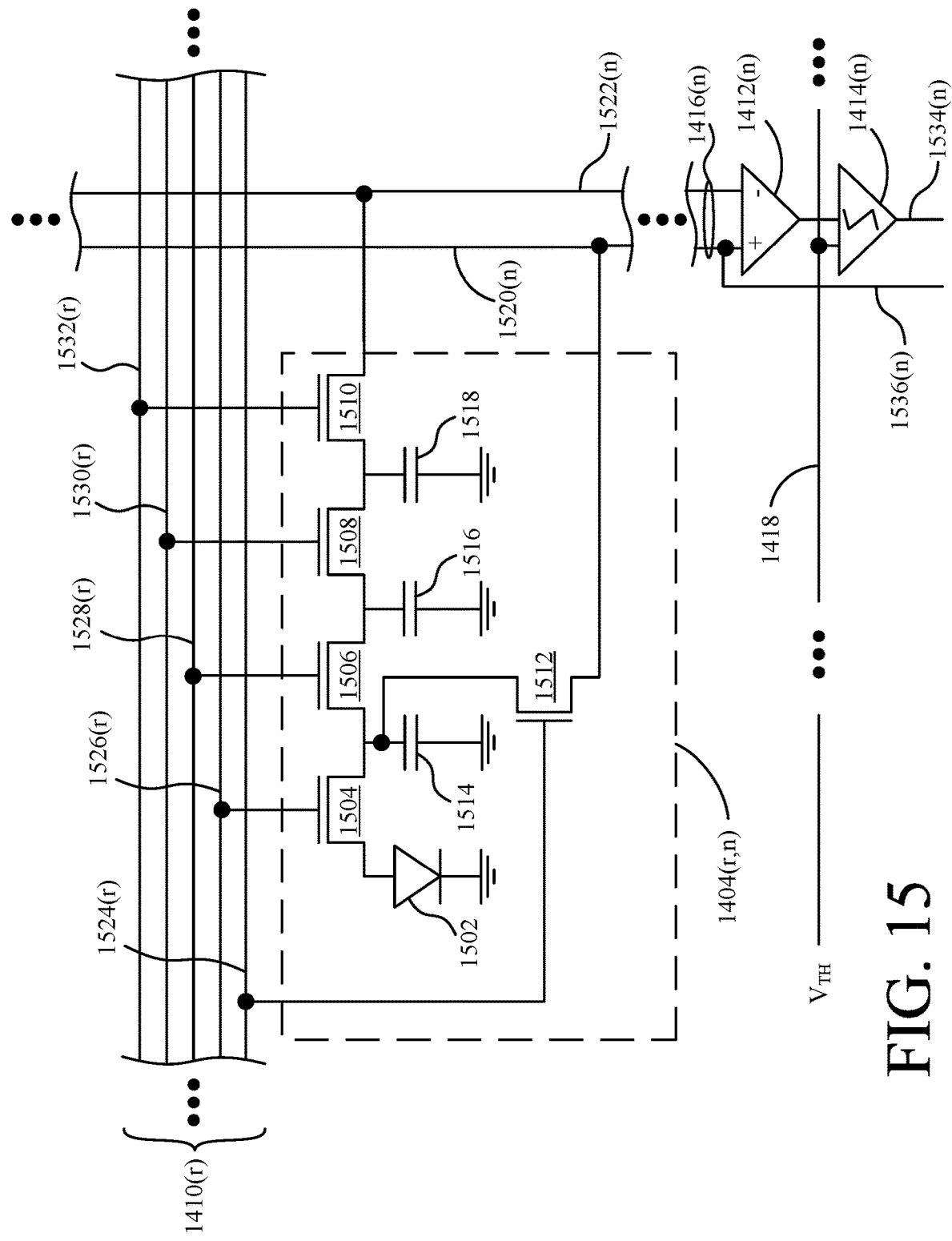
FIG. 15 is a circuit diagram of a pixel of the imaging device of FIG. 14.

FIG. 15 is a circuit diagram of a pixel 1404(r,n) located in row (r) and column (n) of pixel array 1402. The other pixels 1404 are substantially identical. Pixel 1404(r,n) includes a photosensor 1502, switching transistors 1504, 1506, 1508, 1510, 1512, and charge storage elements (e.g., capacitors) 1514, 1516, 1518. Switching transistor 1504 selectively couples photosensor 1502 to current signal capacitor 1514, which stores the current signal from photosensor 1502. Switching transistor 1506 selectively couples transfer capacitor 1516 to current signal capacitor 1514 (and to photosensor 1502 when switching transistor 1504 is also on), so that the capacitor 1516 also receives the current signal from photosensor 1502. Switching transistor 1508 selectively couples transfer capacitor 1516 to background capacitor 1518, which stores an accumulated background image acquired over several frames. Switching transistor 1510 selectively couples background capacitor 1518 to background signal line 1522(n), which provides the background signal to differencing circuit 1412(n). Switching transistor 1512 selectively couples current signal capacitor 1514 to current signal output line 1520(n), which provides the current signal to differencing circuit 1412(n).

Together, differencing circuit 1412(n) and comparator 1414(n) determine whether the current signal from pixel 1404(r,n) is an exceedance. In particular, differencing circuit 1412(n) subtracts the background signal from the current signal and provides the remainder signal to a first input of comparator 1414(n). The second input of comparator 1414(n) is coupled to a predetermined reference voltage $V_{TH}$ line 1418. If the remainder signal exceeds $V_{TH}$, then the output of comparator 1414(n) indicates (e.g., logical high) that the signal from pixel 1404(r,n) is an exceedance. Otherwise, the output of comparator 1414(n) indicates (e.g., logical low) that the signal from pixel 1404(r,n) is not an exceedance. In addition, current signal line 1520(n) is coupled to transmit current image data, via signal line 1535(n) to control and processing circuit 1408, bypassing differencing circuits 1412(1-N) and comparators 1414(1-N).

Row controller asserts control signals on control lines 1410(1-R) to sequential control one row of pixels at a time. Control line 1524(r) is coupled to control terminal of transistor 1512; control line 1526(r) is coupled to control terminal of transistor 1504; control line 1528(r) is coupled to control terminal of transistor 1506; control line 1530(r) is coupled to control terminal of transistor 1508; and control line 1532(r) is coupled to control terminal of transistor 1510. The operation of Pixel 1404(r,n) operates as follows. Pixels 1404 sense the light focused by the optical system onto array 1402. An image is formed when light impinges upon photosensor 1502, converting the particles of light, photons, into photocarriers which are stored on current signal capacitor 1514 and transfer capacitor 1516 in or under the pixel. Current signal capacitor 1514 stores the current frame information (optical intensity signal), which is output through switching transistor 1512, onto current signal output line 1520(n) and into the positive input of differencing circuit 1412(n). The background signal (a temporal low pass filtered image) from background capacitor 1518 is provided, via transistor 1510 and background signal line 1522(n), to the negative input of differencing circuit 1412(n), which creates a temporal background normalized image by subtracting the background filtered image from the normal oversampled pixel image. The background signal accumulated on background capacitor 1518 is a switched capacitor average that has a time constant of about 400 ms to 20 seconds. Subtraction of the low pass frame value stored on background capacitor 1518 reduces the clutter and noise, as will be shown below with reference to FIGS. 18-20.

Subtracting the background signal stored on background capacitor 1518 from the current frame stored on signal capacitor 1514 generates a background normalized image, and this background normalize image is compared by comparator 1414(n) on a pixel-by-pixel basis, so that if the value of any of the pixels exceeds a local or global threshold then these pixels are identified as "exceedances". The threshold value is typically a factor of 3-6 times the filtered temporal noise level of the pixels. The time constant or the switches interconnecting current signal capacitor 1514, transfer capacitor 1518, and background capacitor 1518 determine the low frequency memory rate for the voltage on background capacitor 1518 for each pixel 1404 of the imaging arrays' ROIC.

Figure 20:
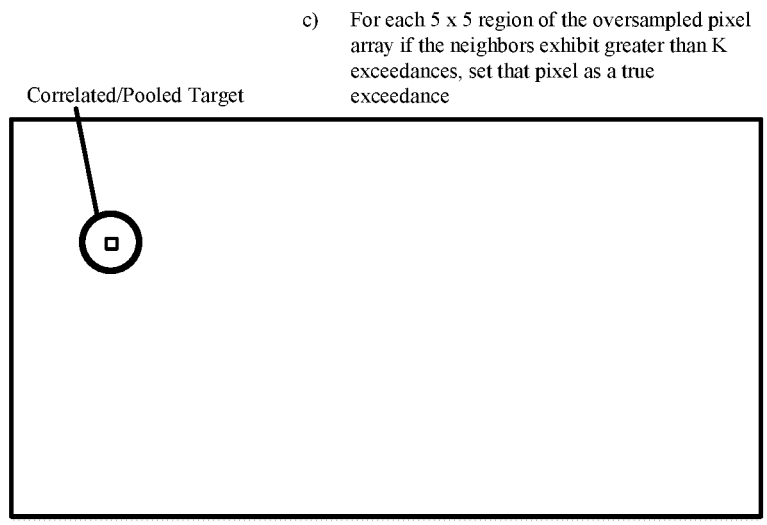
FIG. 20 shows the output of the background suppressed, thresholded and correlated frames where the singular noisy pixels are rejected by the pooling/correlation algorithm.

For all pixels in a raw exceedance frame, the exceedances in a local neighborhood surrounding a particular central pixel in a 2×2 to 8×8 (or even larger) subregion are counted. So, in our current example using a 5×5 local subregion, the number of other local pixels that are also identified as exceeding the threshold can vary from 0-24. Local pooling or correlation calculation occurs by counting the number of pixels in each subregion. If the number of exceedances in each pixel local subregion exceeds a predetermined pooling threshold number N, then pixel is identified as having a pooled exceedance. Pooling is similar to pixel correlation, but done in a binary manner for simplicity in calculations and speed. If the number of local pixels that are exceedances is greater that the pooling number, then the pixel has a pooled exceedance. This corresponds to sensing a potential target because several local pixels are also identified as exceedances. In this case, the pooled exceedance value is set to a value of "one" (e.g., logical high, true, etc.). If the number of exceedances in the subregion is less than the pooling number, the exceedance corresponds to a noise spike and then the pooled exceedance value is set to a value of "zero" (e.g., logical low, false, etc.). After this image processing the normal (current signal), raw exceedance, and pooled exceedance frames are output. The raw exceedance frame is then a raster scanned digital representation of uncorrelated potential targets, and the pooled exceedance is a raster scanned digital representation of correlated or pooled targets, as shown in FIG. 20.

A simple example of pooling is provided with reference to FIG. 14. The pixels with dark Xs have been determined to be exceedances. That is, the background normalized signals from those pixels exceeds a predetermined voltage threshold. For the purpose of this explanation, the process will use a 3×3 subregion and a pooling number of 3. In the 3×3 subregion surrounding exceedance pixel 1422, there is only one other exceedance pixel. Therefore, because 1 is not greater than 3 (the pooling number), pixel 1422 is not identified as a pooled exceedance. In contrast, the 3×3 subregion surrounding pixel 1424 includes 4 other exceedance pixels. Therefore, because 4 is greater than 3 (the pooling number), pixel 1424 is identified as a pooled exceedance.

The present example embodiment uses a voltage mode readout circuit. It should be understood, however, that a charge mode readout circuit, or any other suitable readout circuitry can be employed.

Figure 16:
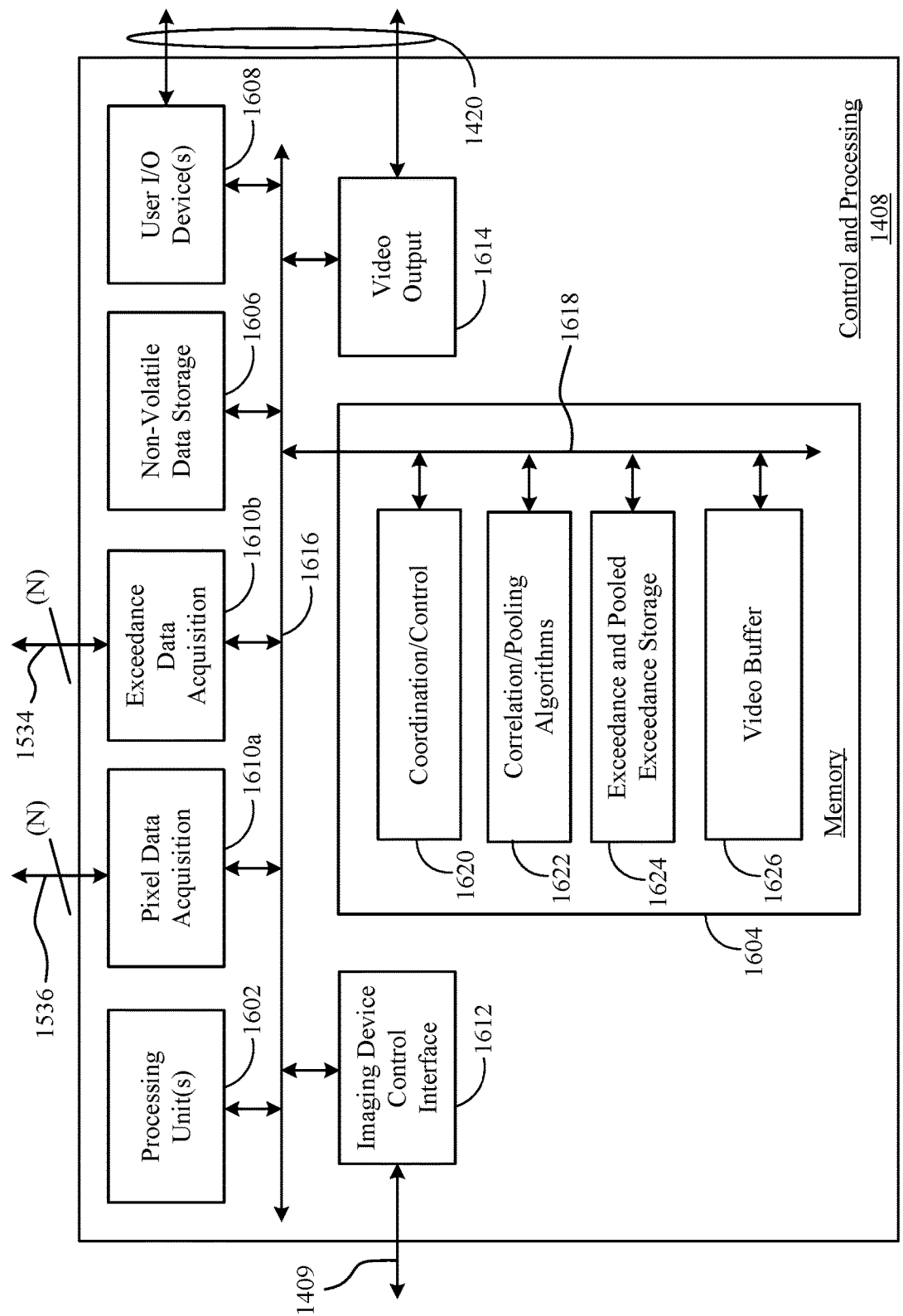
FIG. 16 is a block diagram of control and processing circuitry of the imaging device of FIG. 14.

FIG. 16 is block diagram showing control and processing circuit 1408 in greater detail. In this particular embodiment, processing circuit 1408 is a general purpose computer programmed to carry out the novel image data processing of the present invention. Examples of such general purpose computers include, but are not limited to, personal computers, super computers, system-on-a-chip computers, programmable arrays, and so on. Indeed, the ROIC of the present invention can be integrated into a single chip that also includes such a general purpose computer. In addition, aspects of the present invention, especially the data processing algorithms, can be embodied in a non-transitory, electronically-readable medium, which has code embodied therein to cause an electronic device to carry out the novel processes disclosed herein.

Control and processing circuit 1408 includes one or more processing units 1602, memory 1604, non-volatile data storage 1606, user input/output (I/O) devices 1608, pixel data acquisition interface 1610a, exceedance data acquisition interface 1610b, imaging device control interface 1612, and video output device 1614, all intercommunicating via a system bus 1616 and a memory bus 1618. Processing unit(s) 1602 impart functionality to control and processing circuit 1408 by executing code stored in non-volatile data storage 1606 and memory 1604. Non-volatile data storage 1606 retains data and code, even when control and processing circuit 1408 is powered down. Memory 1604 provides working memory for data and code executed by processing units 1602. In actual operation, code is transferred into memory 1604 from non-volatile data storage 1606 as necessitated by the programs being executed. However, for the sake of clear explanation, the functional features of the present invention are represented by code blocks in memory 1604. In addition, some programming (e.g., operating system, device drivers, etc.) of control and processing circuit 1408 is omitted, because such programming is not necessary for a complete understanding of the present invention.

Pixel data acquisition interface 1610a receives pixel data (photo intensity signals) from pixel array 1402 via signal lines 1536, which bypass differencing circuits 1412 and comparators 1414 (FIG. 15), and transfers the pixel data to memory 1604. Imaging device control interface 1612 provides control signals to row controller 1406 via control signal lines 1409, which in turn causes pixel array 1402 to acquire images and provide the pixelated image data to pixel data acquisition interface 1610a.

User I/O devices 1608 facilitate communication between control and processing circuit 1408 and a user. Examples of user I/O devices include, but are not limited to, display monitors, keyboards, pointing devices, speakers, and so on. Communication between control and processing circuit 1408 and a user can include, but is not limited to, user control signals, the input of system settings (e.g., pooling number, size of subregion used to calculate pooled exceedances, etc.), the output of filtered image data, the output of identified targets, and so on.

Video output 1614 provides conventional video that has been captured by pixel array 1402. The conventional video that is output by video output 1614 is video that has not undergone the filtering and pooling processes of the present invention.

The operation of control and processing circuit 1408 will now be explained with reference to the representative blocks of code in memory 1604. Coordination and control routine 1620 provides high level coordination and control over the other code being executed by processing unit 1602. Correlations/Pooling algorithms 1622 operate on the exceedance data to determine pooled exceedances, and, because control and processing circuit 1408 includes the features of a general purpose computer, more elaborate correlation techniques can also be employed. Exceedance and pooled exceedance storage 1624 include exceedance and pooled exceedance data/frames calculated and used/reused by pooling algorithms 1622. Image data frame buffer 1626 stores one or more frames of pixelated image data, which can be analyzed by pooling algorithms 1622, although in this example embodiment exceedances are determined in the ROIC by differencing circuits 1412(1-N) and comparators 1414(1-N).

Figure 17:
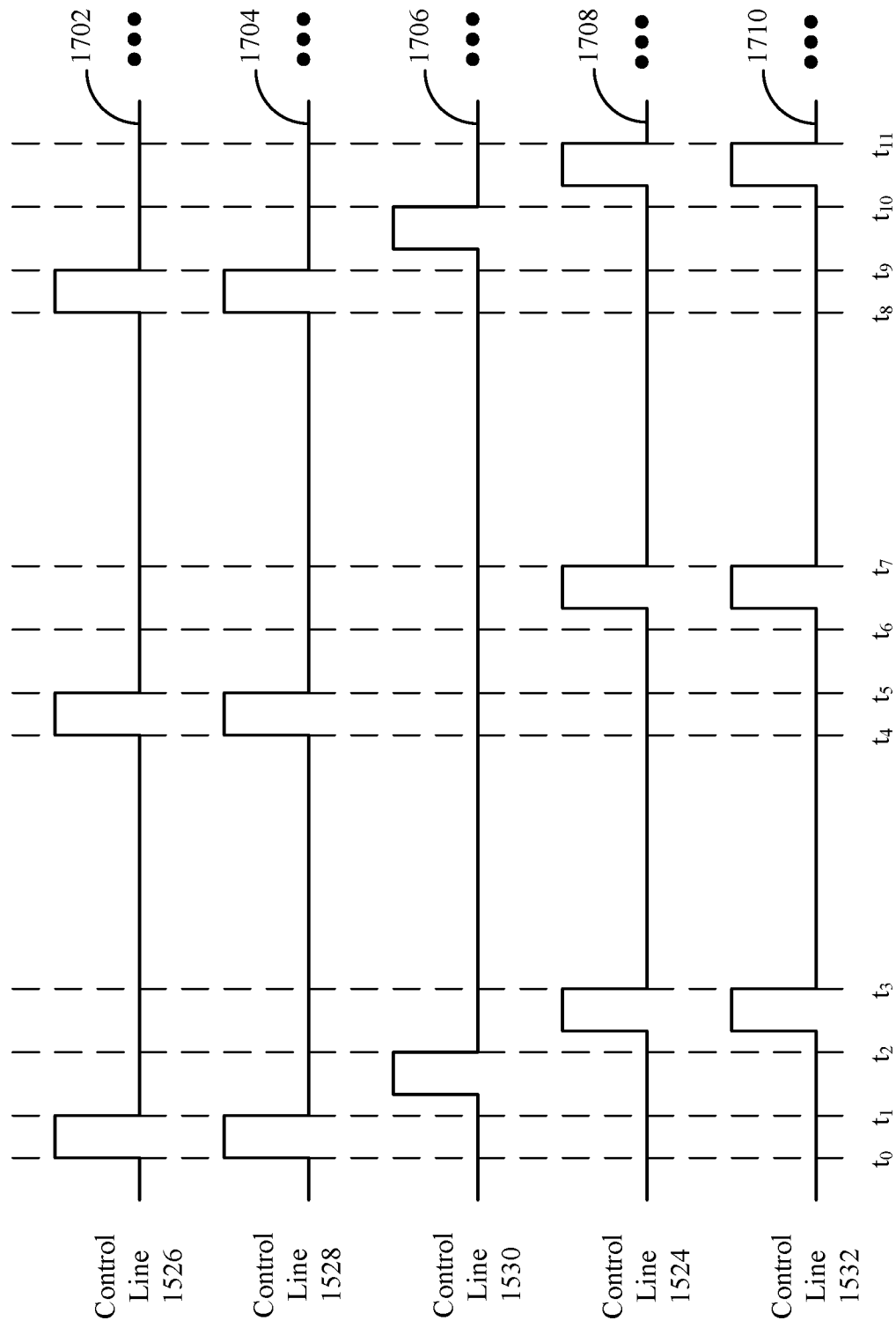
FIG. 17 is a timing diagram of control signals applied to the pixel circuitry of FIG. 15.

FIG. 17 is a timing diagram showing the control signals asserted on by row controller 1406 (FIG. 14) onto control lines 1526, 1528, 1530, 1524, and 1523 (FIG. 15). Just prior to time t0, photosensor 1502 is accumulating photoelectrons as a result of incident light. Then, at time to, a high signal is asserted on both of control lines 1526 and 1528. The high signal on control lines 1526 and 1528 cause transistors 1504 and 1506 to go into a conducting state ("on"), so that the accumulated charge on photosensor 1502 is transferred to capacitors 1514 and 1516. Next, at time t1, the signals on control lines 1526 and 1528 go low, causing transistors 1504 and 1506 to be in a nonconducting state ("off"), isolating capacitors 1514 and 1516 from photosensor 1502 and each other.

Shortly after time t1, a high signal is asserted on control line 1530, which turns transistor 1508 on. When transistor 1508 is on, the charge that was previously transferred to transfer capacitor 1516 is combined with background capacitor 1518. Then, at time t2, the signal on control line 1530 goes low, turning transistor 1508 off, again isolating transfer capacitor 1516 from background capacitor 1518. The capacitance of background capacitor 1518 is much greater than that of transfer capacitor 1516, which provides, in effect, a low pass filter for pixel/image signal transferred to background capacitor 1518.

Next, shortly after time t2, high signals are asserted on control lines 1524 and 1532, turning transistors 1510 and 1512 on. When transistor 1510 is on, the background signal from background capacitor 1518 is asserted on background signal output line 1522(n). Also, when transistor 1512 is on, the current signal from capacitor 1514 is asserted on current signal output line 15220(n). During this time, the pixel data and exceedance data from pixel 1404(r,n) are read into control and processing circuit 1408 (FIG. 14). After a sufficient time has passed, at time t3, the control signals on control lines 1524 and 1532 both go low, turning transistors 1512 and 1510 off, and isolating current signal capacitor 1514 and background signal capacitor 1510 from current signal output line 1520(n) and background signal output line 1522(n), respectively. This completes a pixel data transfer cycle for one row of pixels.

During the time period from t1, until the next data transfer cycle starts at time t4, which is known as the integration period, photosensor 1502 continues to accumulate charge. Optionally, reset circuitry can be provided to reset the charge on photosensor 1502 immediately preceding the integration period. In addition, the timing diagram of FIG. 17 is not to scale. In particular, the integration period and/or the time between pixel reads would be relatively longer than that shown. Between the end of one pixel read cycle (t3) and the beginning of the next pixel read cycle (t4), row controller can process the other rows of pixel array 1402.

The second pixel read cycle (t4-t7) and the third pixel read cycle (t8-t11) are substantially the same as the first pixel read cycle (t0-t3), except that during the second pixel read cycle (t4-t7) no high signal is asserted on control line 1530. Indeed, the user can specify via system settings how often the background capacitor 1518 is updated with the signal from transfer capacitor 1516. For example, the signal can be transferred every Mth frame, where M is a positive integer. In the example timing diagram of FIG. 17, M=2 so the background capacitor 1518 receives charge transfer from the transfer capacitor 1516 every other frame. If M=1, the background capacitor 1518 receives charge transfer from the transfer capacitor 1516 every frame. If M=3, the background capacitor 1518 receives charge transfer from the transfer capacitor 1516 every third frame, and so on. This affectively controls the band pass rate of the background image.

Figure 18:
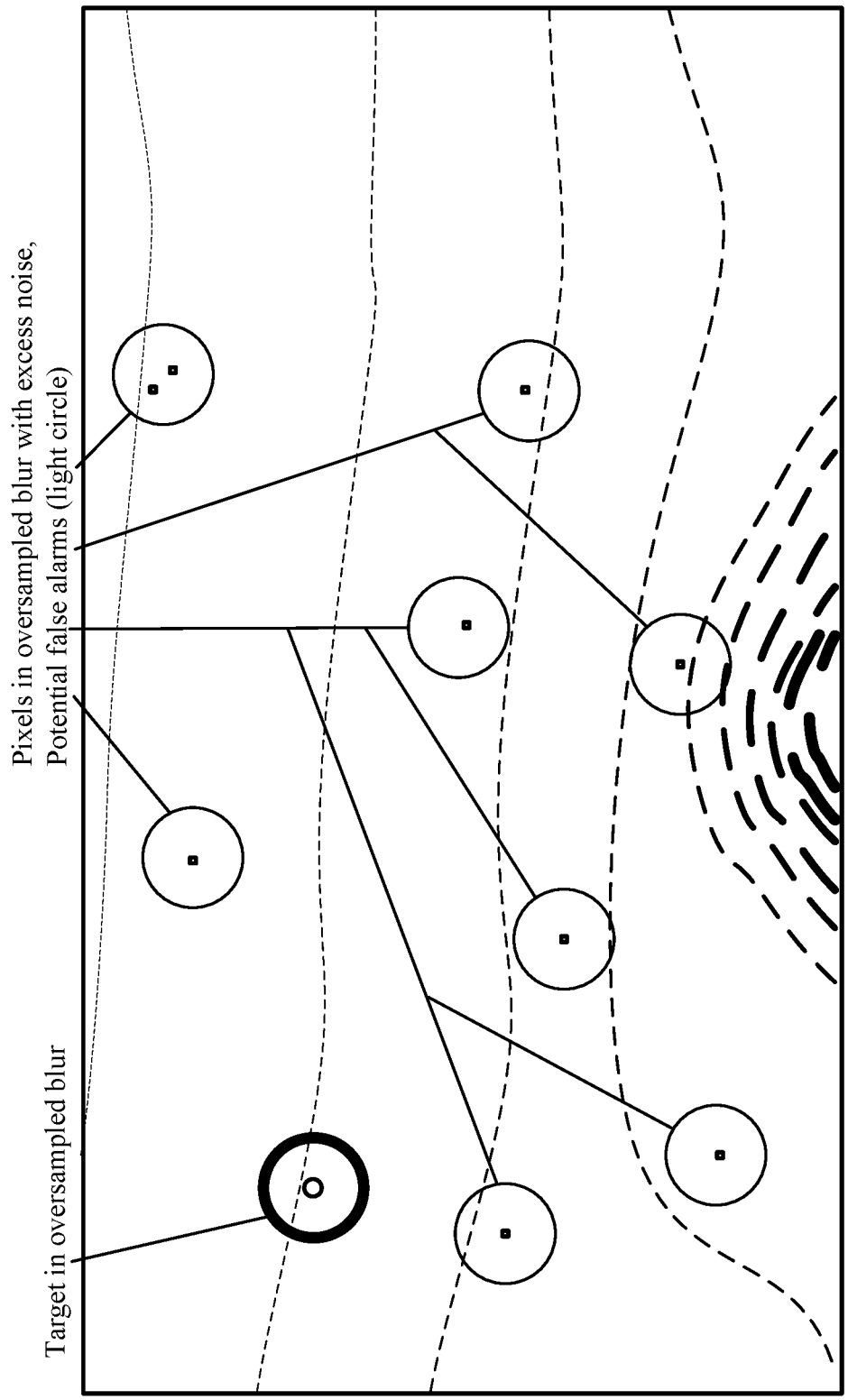
FIG. 18 is an image from a MWIR sensor with a real target and several single pixel noise outliers randomly distributed throughout the image.

FIG. 18 is an illustration representative of an image with both a real target and noisy elements in an oversampled imager, before applying the filtering, exceedance, and pooling algorithms of the present invention.

Figure 19:
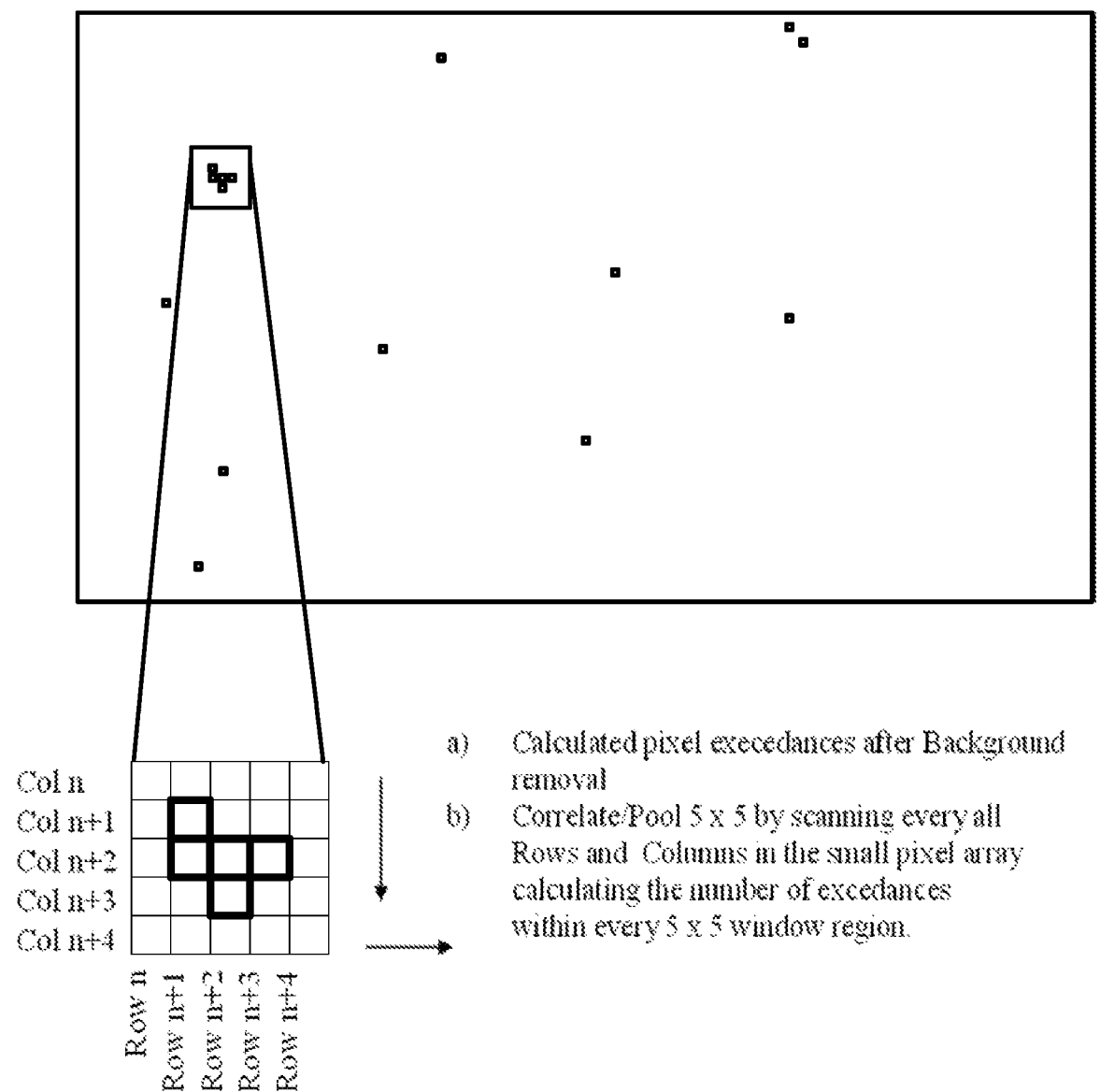
FIG. 19 shows the image of FIG. 18 after background normalization/suppression with both real target and point like excess noise, but before the signals are processed by the pooling/correlation algorithm.

FIG. 19 shows the image of FIG. 18 after the background is removed. The image shows residual temporal noise from the background suppression, bad pixels, and a real target. The image of FIG. 19 is representative of a raw exceedance frame. In this example, the pooling algorithms are implemented so that the number of exceedances within a 5×5 region of each pixel can be calculated, and then if the number of exceedance is above the required exceedance pixel threshold value K, then that pixel is associated with a pooled value of "one", representing a real target in these oversampled pixels.

FIG. 20 shows that the correlation or pooling method successfully eliminated the noisy pixel outliers, while correctly identifying the real target, thereby reducing the false alarms sometimes associated with non-critically sampled pixel imaging systems.

Figure 21:
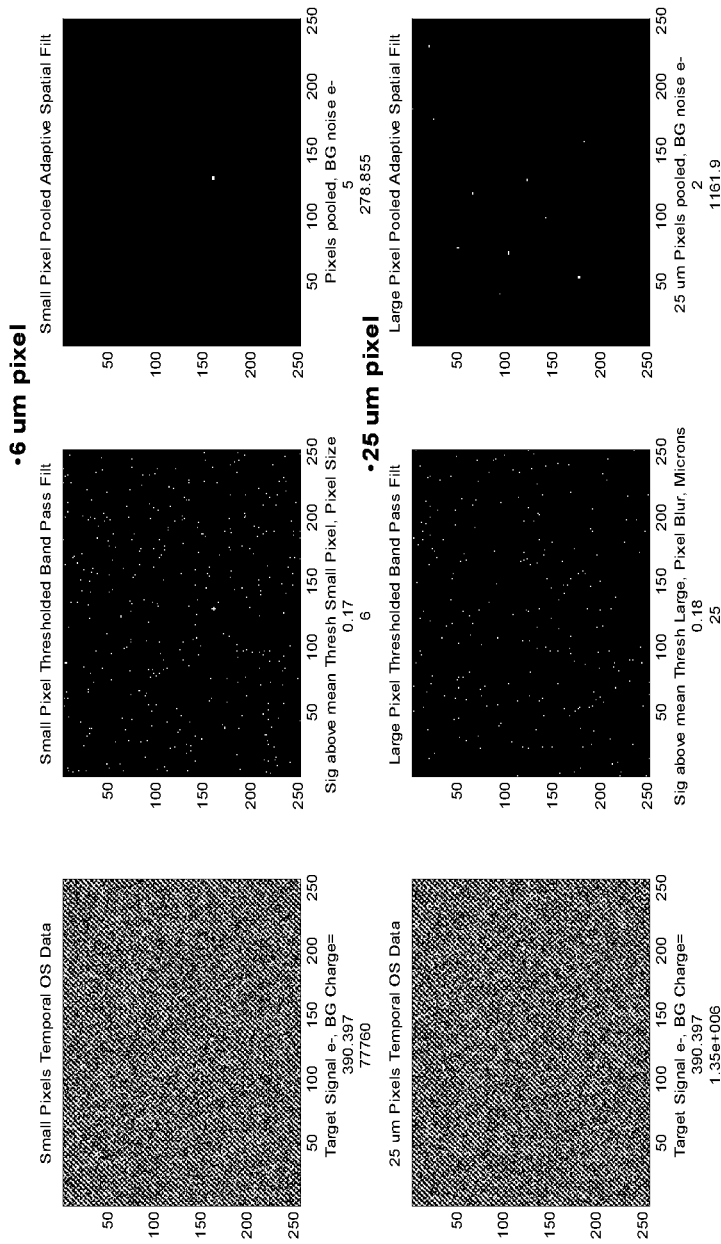
FIG. 21 is example of imagery illustrating increased resolution, acuity, and sensitivity of a 6 μm superpixel array over a larger 25 μm pixel array.

FIG. 21 is example of imagery illustrating increased resolution, acuity, and sensitivity of a 6 μm superpixel array over a larger 25 μm pixel array when the blur size from an IR Optical Sensor is approximately 25 microns. The processing of background suppression, thresholding, and pixel pooling reveal in the upper right hand image of the oversampled pixel array that a target is detected, that all of the noise pixels are suppressed by the correlation pooling algorithm, and that no false positive detections are caused. In the lower right hand image, the pooling of the non-oversampled image (large pixel array) is unable to detect the same amplitude target due to insufficient signal-to-noise ratio (SNR) and lack of good correlation of the larger pixel imager. Thus, FIG. 21 demonstrates that the signal to noise ratio, and hence long range/dim target detection, can be reduced with superpixel oversampling and pooling.

Figure 22:
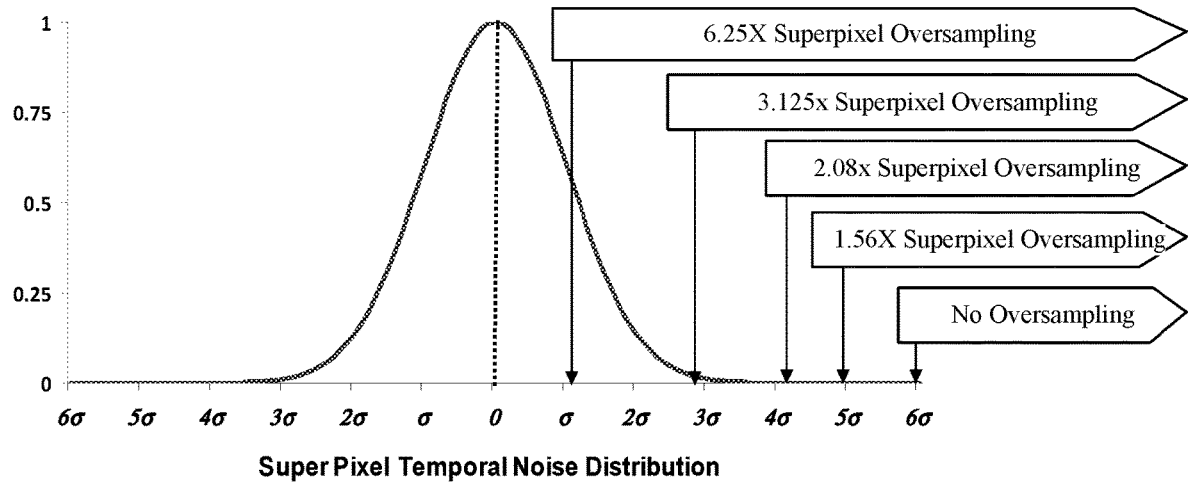
FIG. 22 is a figure of the superpixel image sensor residual Temporal Noise Distribution after background normalization (e.g., background removal), illustrating that as the oversampling ratio increases, the ability to reduce the threshold and still track objects without excess false positives is improved.

FIG. 22 is a graph of a representative superpixel image sensor temporal noise distribution. The graph shows how the dim signal threshold can be set to noise values that lie within the residual background-subtracted noise histogram. The graph also shows how the signal detection is improved with spatial oversampling by allowing the signal intensity to fall within the noise histogram. The figure shows that the greater the oversampling, the deeper into the noise histogram the system can extract potential targets and simultaneously suppress false alarms. The results of this advantage are shown visually by the images of FIG. 21.

Figure 23:
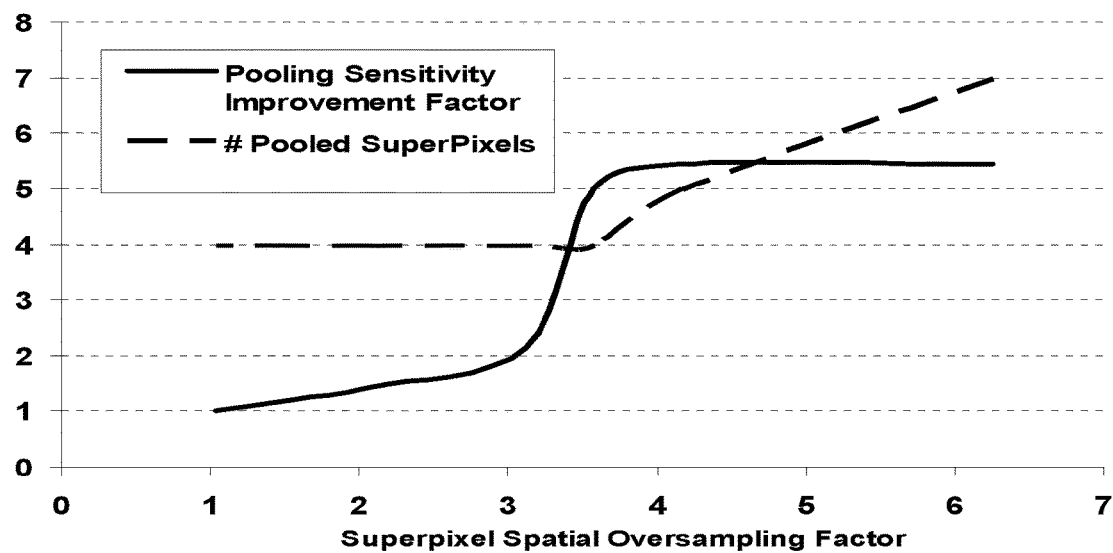
FIG. 23 shows qualitatively how the oversampled imager technique provides a sensitivity improvement known as the pooling sensitivity improvement factor for a particular pixel size.

FIG. 23 shows qualitatively how the superpixel imager technique provides a sensitivity improvement as the oversampled pixel pooling sensitivity improvement factor. The superpixel oversampling factor is calculated by dividing the value of the full width of the optics blur by the pixel size on one edge.

Figure 24:
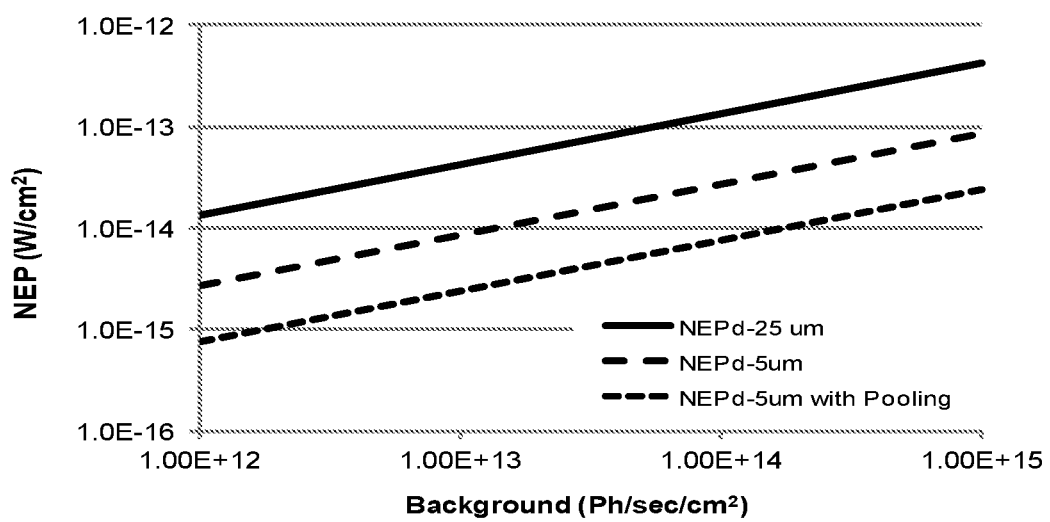
FIG. 24 shows how, with nominal quantum efficiency and integration time, the Noise Equivalent Power (NEP) improves with smaller pixels and with oversampled superpixels, how the improvement is further increased with correlation pooling.

FIG. 24 shows an example of how the superpixel pooling improves the Noise Equivalent Power (NEP) performance factor due to amount of sensor oversampling for the nominal 4 micron Midwave IR sensor and F/2.5 optics assuming no aberrations.

The minimal detectable power, the Noise Equivalent Power (NEP), for an imaging sensor is given from Reference E. L. Dereniak, G. D. Borman, "Infrared Detectors and Systems". (Wiley Series in Pure and Applied Optics), April, 1996, as:

$$NEP(\lambda, f) = 2 * \left[\frac{Ebg * Adet * \Delta f}{qe}\right]^{1/2} \left[\frac{h*c}{\lambda}\right] \times \text{Factor}_{Oversampling}$$

Where, Ebg is the background exitance in photons/sec/cm², Adet is the area of the detector, and $\Delta f = \frac{1}{2} \times$ Tintegration for a sampled system. QE is quantum efficiency, h=Plancks constant, c is the speed of light, and λ is the center wavelength of the incident light. Factor Oversampling is given by the Pooling Sensitivity Improvement factor shown in FIG. 24. According to the formula, the NEP is reduced with the area of the detector and increasing the integration time, as well as increasing the oversampling factor from FIG. 24.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as set forth in this or related applications.

I claim:

1. An imaging system comprising:
   optics including a limiting aperture and a focal length, said limiting aperture and said focal length defining a diffraction limited minimum blur of the system for electromagnetic radiation of a particular wavelength ($\lambda$);
   a sensor array including a plurality of individual pixels disposed in a focal plane defined by said optics and sensitive to said particular wavelength of electromagnetic radiation, said pixels being small enough to allow said diffraction limited minimum blur to impinge on a first number of said pixels simultaneously, said first number being an integer greater than one (1); and
   circuitry connected to receive image data from said sensor array, said image data including a plurality of signals each corresponding to one of said plurality of individual pixels and indicative of an amount of electromagnetic radiation impinging on said corresponding one of said plurality of individual pixels of said sensor array; and wherein
   said circuitry is operative to identify false positive noise signals from properly operating ones of said individual pixels by correlating said signal corresponding to a particular pixel with a second number of others of said pixels within a predetermined area associated with said particular pixel, said second number being an integer greater than or equal to one (1); and
   said second number of said pixels is based at least in part on said first number of said pixels; and wherein said circuitry is operative to
   capture a first image by storing a first intensity value from each pixel of said plurality of individual pixels;
   capture a second image by storing a second intensity value from each pixel of said plurality of individual pixels;
   for each pixel of said plurality of individual pixels, subtract said first intensity value from said second intensity value to obtain a remainder value associated with each pixel of said plurality of individual pixels;
   compare each said remainder value to a predetermined threshold value to determine whether each said remainder value exceeds said predetermined threshold value;
   for each pixel of said plurality of individual pixels associated with one of said remainder values that exceeds said predetermined threshold value, determine whether each of said second number of others of said pixels within said predetermined area associated with said particular pixel is also associated with a remainder value that exceeds said predetermined threshold value;
   associate a value indicative of a verified signal with said particular pixel if at least a predetermined number of said remainder values associated with said second number of others of said pixels exceed said predetermined threshold value; and
   associate a value indicative of a false signal with said particular pixel if at least said predetermined number of said remainder values associated with said second number of others of said pixels do not exceed said predetermined threshold value.

2. The imaging system of claim 1, wherein said second number is less than said first number.

3. The imaging system of claim 2, wherein said second number is exactly one less than said first number.

4. The imaging system of claim 2, wherein said first number is at least four (4).

5. The imaging system of claim 4, wherein said second number is greater than or equal to one (1) and less than or equal to three (3).

6. The imaging system of claim 4, wherein said first number is at least nine (9).

7. The imaging system of claim 6, wherein said second number is greater than or equal to one (1) and less than or equal to eight (8).

8. The imaging system of claim 6, wherein said first number is at least sixteen (16).

9. The imaging system of claim 8, wherein said second number is greater than or equal to one (1) and less than or equal to fifteen (15).

10. The imaging system of claim 8, wherein said first number is at least twenty-five (25).

11. The imaging system of claim 10, wherein said second number is greater than or equal to one (1) and less than or equal to twenty-four (24).

12. In an imaging system having optics and a pixelated imager, said pixelated imager including pixels each small enough to allow a diffraction limited minimum blur of said optics to impinge on a first number of said pixels simultaneously, a method of processing image data, said method comprising:
    generating a first image data set from multiple frames of image data acquired from said pixelated imager over time;
    generating a second image data set from a single frame of image data from said pixelated imager;
    subtracting said first image data set from said second image data set on a pixel-by-pixel basis to obtain a remainder value associated with each particular pixel;
    comparing each said remainder value to a predetermined threshold value to determine whether each said remainder value exceeds said predetermined threshold value;
    determining, for each particular pixel associated with one of said remainder values that exceeds said predetermined threshold value, whether each of a second number of pixels within a predefined area associated with said particular pixel is also associated with a remainder value that exceeds said predetermined threshold value;
    associating a value indicative of a verified signal with said particular pixel if at least a predetermined number of said remainder values associated with said second number of other pixels exceed said predetermined threshold value; and
    associating a value indicative of a false positive noise signal with said particular pixel if at least said predetermined number of said remainder values associated with said second number of pixels do not exceed said predetermined threshold value; and wherein
    said second number of pixels is based at least in part on said first number of said pixels; and a false positive noise signal is a signal from a particular pixel indicative of light incident on said particular pixel when no light is being focused on said particular pixel by said optics.

13. The method of claim 12, wherein said first number is at least four (4).

14. The method of claim 13, wherein said second number is greater than or equal to one (1) and less than or equal to three (3).

15. The method of claim 13, wherein said first number is at least nine (9).

16. The method of claim 15, wherein said second number is greater than or equal to one (1) and less than or equal to eight (8).

* * * * *